United States Patent [19]

Ueda et al.

[11] Patent Number: 5,072,285
[45] Date of Patent: Dec. 10, 1991

[54] SEMICONDUCTOR INTEGRATED CIRCUIT HAVING REGION FOR FORMING COMPLEMENTARY FIELD EFFECT TRANSISTORS AND REGION FOR FORMING BIPOLAR TRANSISTORS

[75] Inventors: Masahiro Ueda; Toshiaki Hanibuchi; Kimio Ueda, all of Hyogo, Japan

[73] Assignee: Mitsubishi Denki Kabushiki Kaisha, Tokyo, Japan

[21] Appl. No.: 482,954

[22] Filed: Feb. 22, 1990

[30] Foreign Application Priority Data

Feb. 23, 1989 [JP] Japan .................................. 1-44303
Dec. 1, 1989 [JP] Japan .................................. 1-313770

[51] Int. Cl.$^5$ ............................................ H01L 27/10
[52] U.S. Cl. ........................................ 357/45; 357/34; 357/43
[58] Field of Search ............................ 357/43, 45, 34

[56] References Cited

U.S. PATENT DOCUMENTS

| | | | |
|---|---|---|---|
| 4,682,202 | 7/1987 | Tanizawa ................................ | 357/43 |
| 4,825,274 | 4/1989 | Higuchi et al. ........................ | 357/43 |
| 4,829,200 | 5/1989 | Downey ................................ | 357/43 |
| 4,868,626 | 9/1989 | Nakazato et al. ...................... | 357/45 |
| 4,868,628 | 9/1989 | Simmons ............................... | 357/43 |
| 4,907,059 | 3/1990 | Kobayashi et al. .................... | 357/43 |
| 4,954,865 | 9/1990 | Rokos ................................... | 357/43 |

FOREIGN PATENT DOCUMENTS

| | | | |
|---|---|---|---|
| 0290672 | 11/1988 | European Pat. Off. .............. | 357/43 |
| 52-26181 | 2/1977 | Japan .................................... | 357/43 |
| 57-196560 | 12/1982 | Japan .................................... | 357/43 |
| 62-174965 | 7/1987 | Japan .................................... | 357/43 |
| 63-150935 | 6/1988 | Japan .................................... | 357/43 |
| 63-244767 | 10/1988 | Japan .................................... | 357/43 |

OTHER PUBLICATIONS

"A Subnanosecond Low Power Advanced Bipolar-S-MOS Gate Array", International Conference on Computer Design, 1984, pp. 428-433.

Primary Examiner—Rolf Hille
Assistant Examiner—Steven Loke
Attorney, Agent, or Firm—Lowe, Price, LeBlanc and Becker

[57] ABSTRACT

A Bi-CMOS gate array comprises basic cells combining CMOS transistors and bipolar transistors. The basic cell is formed of a region for forming p-MOS transistors, a region for forming n-MOS transistors and a region for forming bipolar transistors. The region for forming p-MOS transistors comprises gates aligned spaced apart from each other in a first direction and p-type source and drain regions formed spaced apart from each other in the first direction so as to be disposed at the opposite sides of each gate and having a predetermined width. The region for forming n-MOS transistors comprises gates formed spaced apart from each other in the first direction and n-type source and drain regions formed spaced apart from each other in the first direction so as to be disposed at the opposite sides of each gate and having a predetermined width. The region for forming bipolar transistors comprises p-type source or drain region of the region for forming p-MOS transistors as a base region, and an n-type emitter region formed in the base region and a region for taking out the potential of substrate of the p-MOS transistor as a collector region. An npn bipolar transistor formed in the region for forming p-MOS transistors can be electrically isolated from the other p-MOS transistor and used by holding gates disposed at the opposite sides of the base region at a power supply potential.

16 Claims, 26 Drawing Sheets

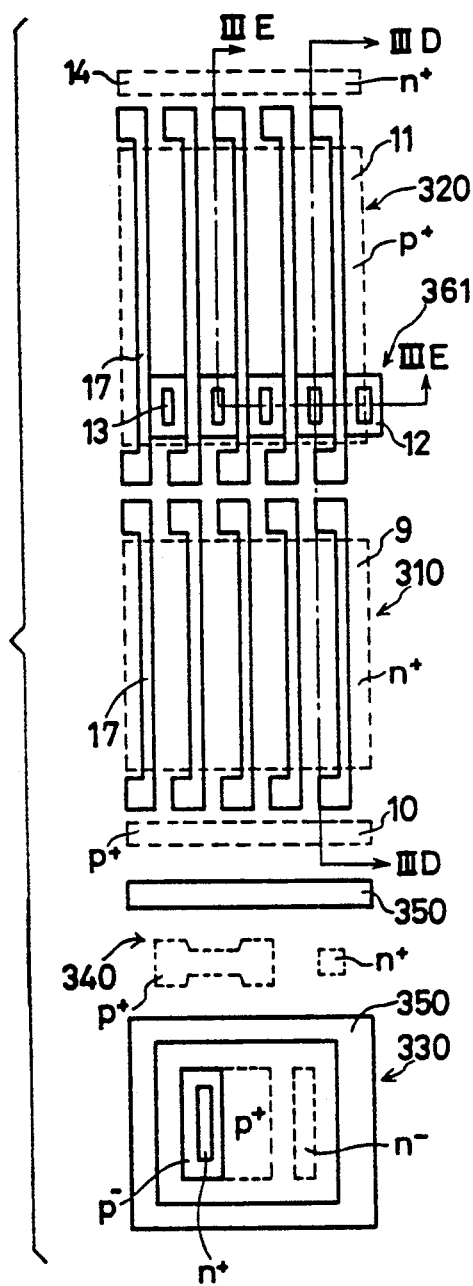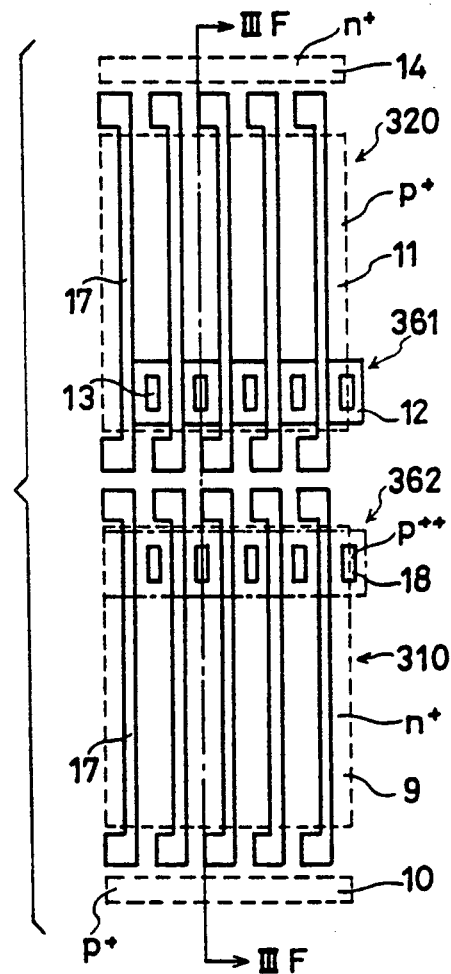

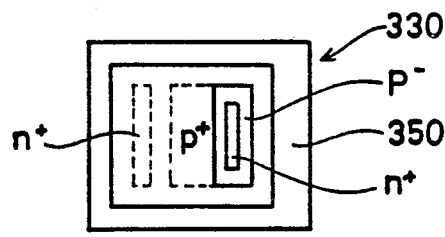
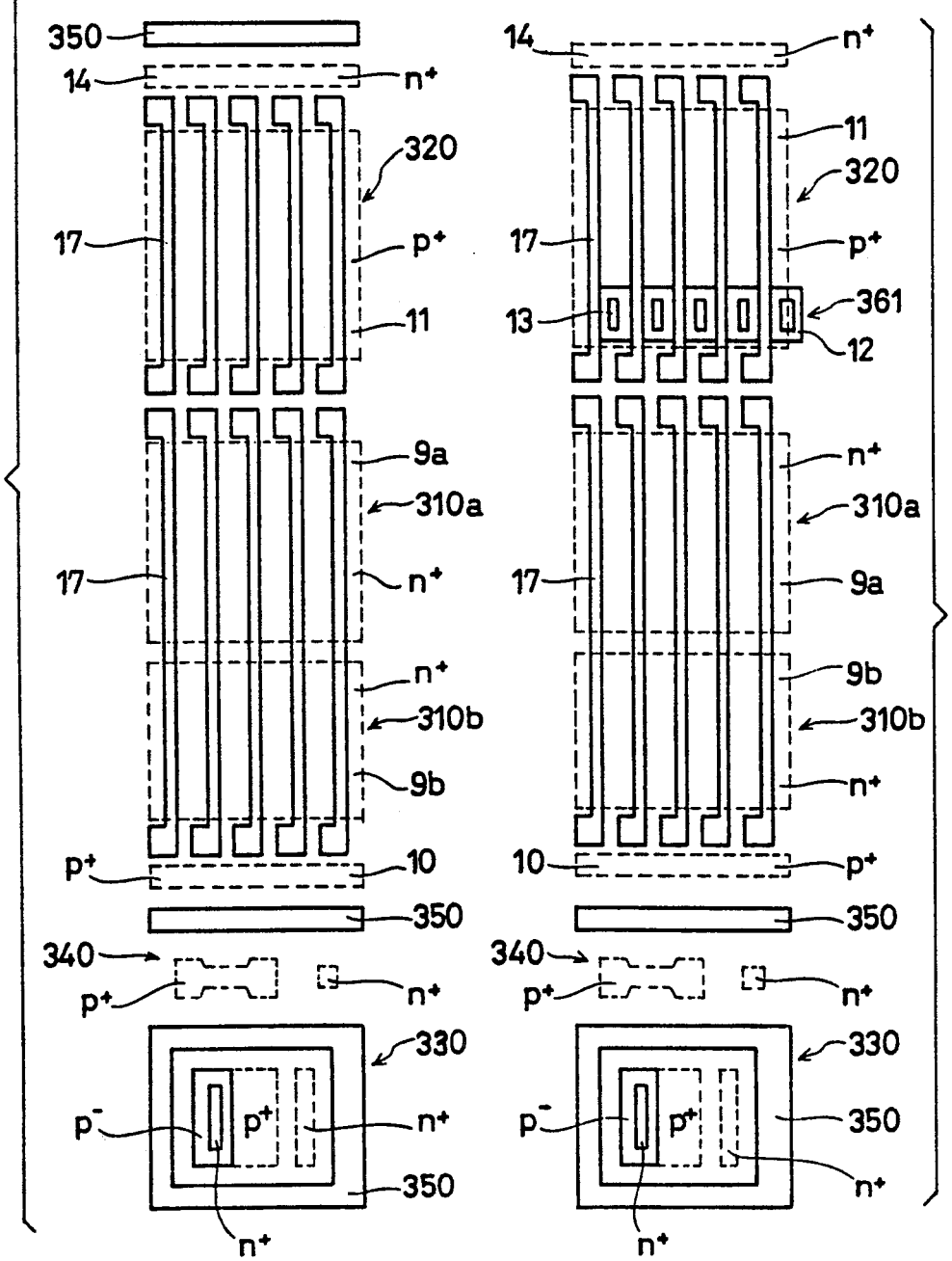

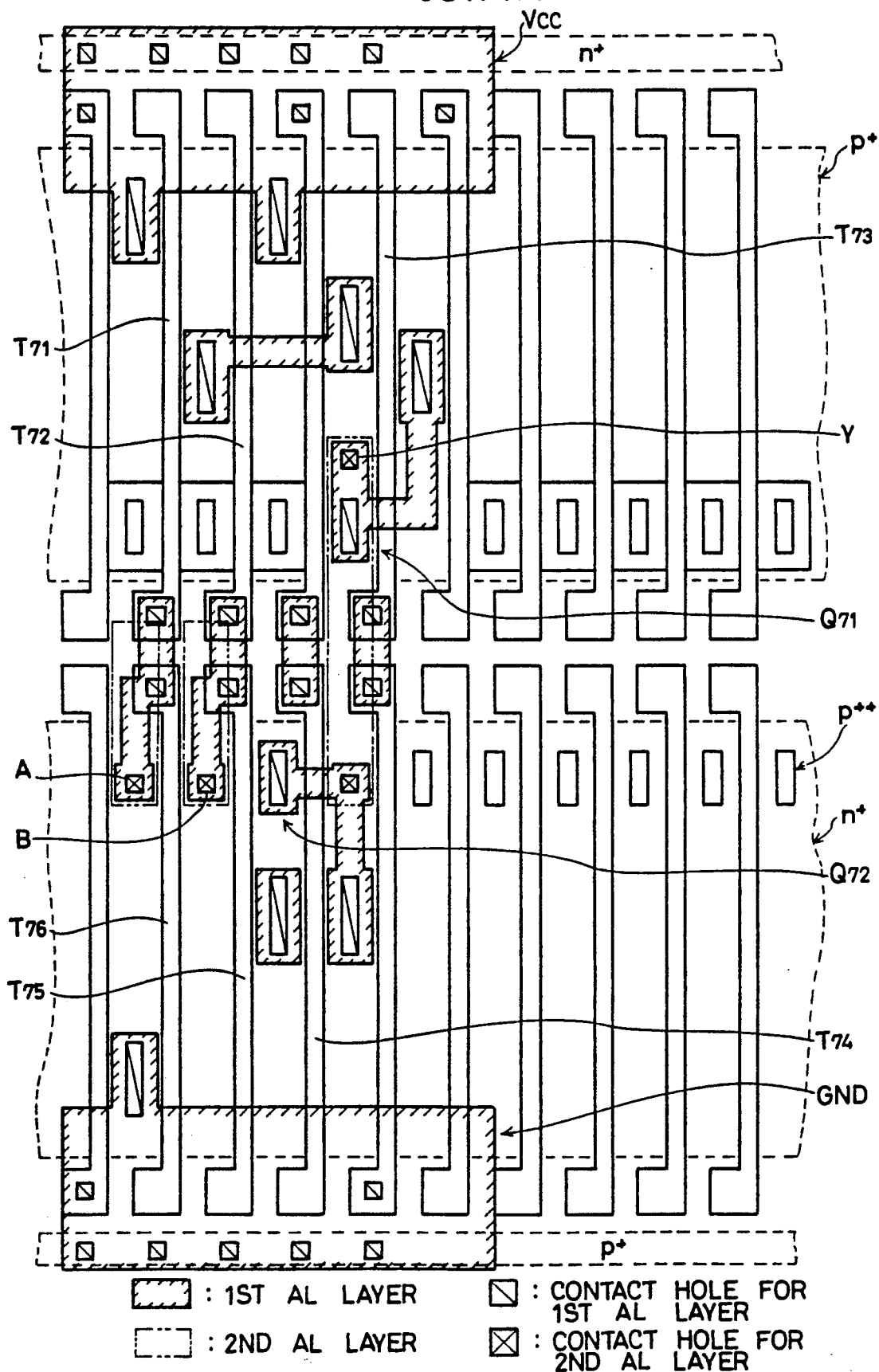

FIG.19A
FIG.19B
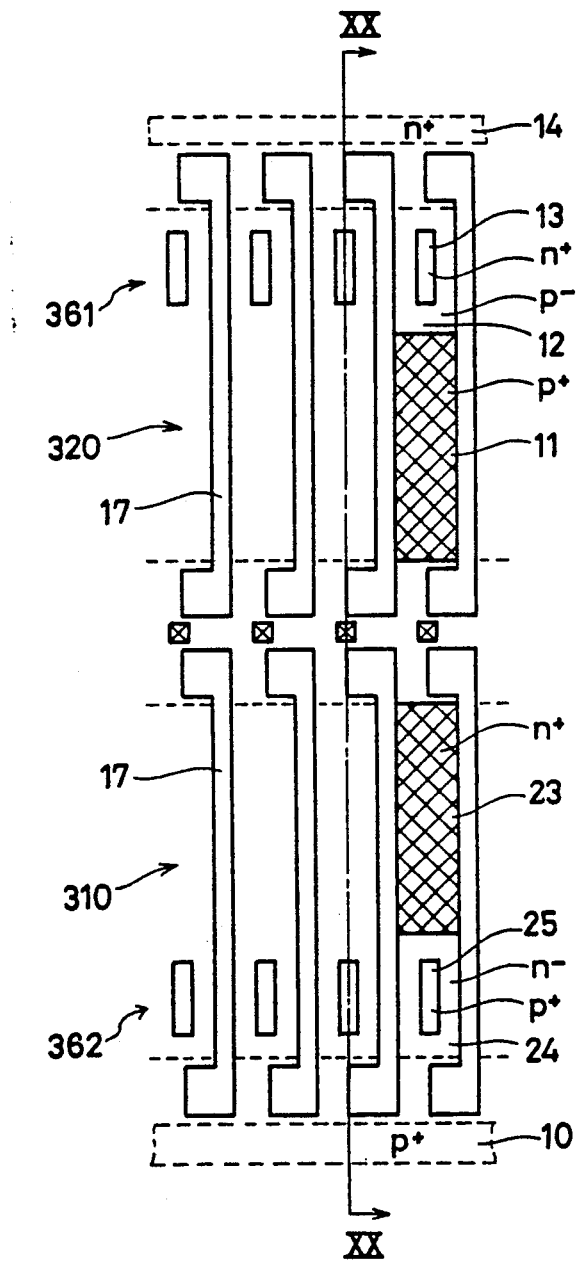
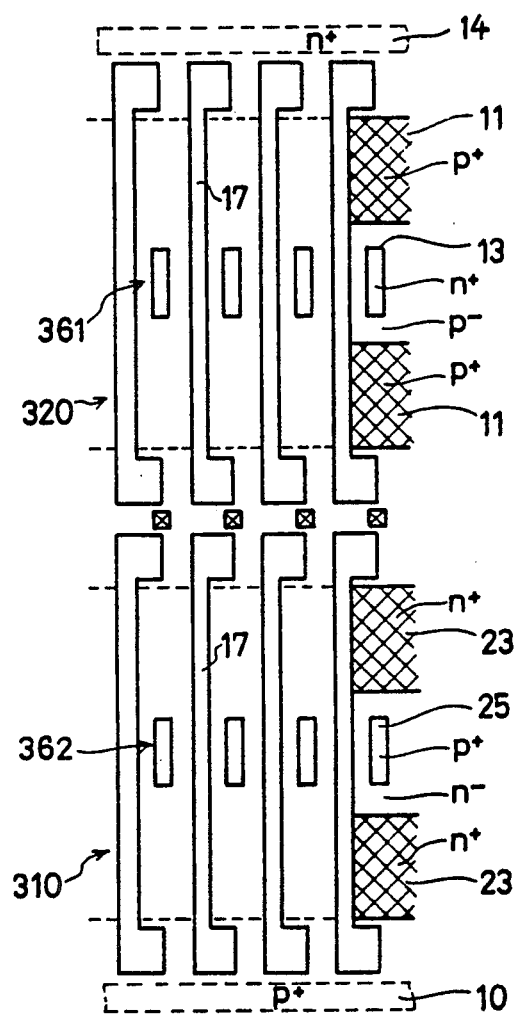

SEMICONDUCTOR INTEGRATED CIRCUIT HAVING REGION FOR FORMING COMPLEMENTARY FIELD EFFECT TRANSISTORS AND REGION FOR FORMING BIPOLAR TRANSISTORS

BACKGROUND OF THE INVENTION

Field of the Invention

The present invention relates generally to semiconductor integrated circuit devices having regions for forming complementary field effect transistors and regions for forming bipolar transistors and a method of manufacturing the same, and more particularly, to a structure of a Bi-CMOS gate array having a basic cell structured by combining CMOS transistors and a bipolar transistor and a method of manufacturing the same.

Description of the Background Art

A gate array has gates referred to as basic cells arranged regularly (in array) on a LSI chip, and is a LSI manufactured by means semi-customized and designed by making full use of CAD by remarkably standardizing design, development and a manufacturing step of a custom LSI. The gate array has been improved and developed to have higher performance and to be highly functional since the beginning of 1970's when it had been made into practice because in the gate array, although a chip size is increased as compared with that of a full-custom LSI, a time period required for the development and manufacturing cost can be reduced.

In recent years, a so-called Bi-CMOS gate array is proposed which combines a bipolar transistor and CMOS transistors, as a circuit capable of operating at a high speed and consuming less power.

FIG. 1 is a schematic plan view showing a structure of a master chip of a conventional gate array. Basic cells 300 are aligned laterally in an input/output buffer region 100. The laterally aligned basic cells 300 constitute a basic cell column 200. An interconnection for connecting the basic cells 300 is provided by a slicing step. In a gate array, an interconnection lattice is usually provided for making interconnections on/between the basic cells 300 by an automatic interconnection disposing method. Each interconnection is made in accordance with this interconnection lattice.

FIG. 2A is a diagram showing a structure of a plane arrangement of a basic cell 300 in a Bi-CMOS gate array in such a gate array as described above. The basic cell 300 is comprised of an n-MOS transistor region 310, a p-MOS transistor region 320 and a bipolar transistor region 330. FIG. 2B shows an intersection of the bipolar-CMOS gate array disclosed in "A SUBNANOSECOND LOW POWER ADVANCED BIPOLAR-CMOS GATE ARRAY", International Conference on Computer Design, 1984, pp. 428-433, which corresponds to an intersection taken along a line IIB—IIB of FIG. 2A. Referring to FIG. 2B, the n-MOS transistor region 310, the p-MOS transistor 320 and the bipolar transistor region 330 are formed on a p type semiconductor substrate. The n-MOS transistor region 310 has source/drain regions 312/313 formed spaced apart from each other and agate electrode 311 formed thereon through an insulation film. The p-MOS transistor region 320 has source/drain regions 322/323 formed spaced apart from each other and agate electrode 321 formed thereon through an insulation film. The bipolar transistor region 330 has a collector region 331, an emitter region 332 and a base region 333 formed so as to junction therebetween. As the foregoing, the n-MOS transistor region 310, the p-MOS transistor 320 and the bipolar transistor region 330 are formed separately from each other through an isolation regions 350.

According to the above described article, by using a Bi-CMOS gate array to constitute, for example, a logic circuit such as a two-input NAND circuit, a bipolar transistor is operated complementarily only during a transition period when a logic gate is changing, whereby none of unnecessary current flows in a normal state, so that a logic circuit can be formed which maintains consumed current as low as that of a CMOS gate array and operates at a high speed.

However, formation of a bipolar transistor region in addition to the MOS transistor region causes the number of elements to be increased, thereby reducing the degree of integration of the gate array chip. In particular, in a gate array the reduction of the degree of integration becomes more marked due to a bipolar transistor region formed separately in order to arrange basic cells in an array. This is clear from that, as shown in FIG. 2A, while in a conventional CMOS gate array, a basic cell is comprised of an n-MOS transistor region and a p-MOS transistor region, in the Bi-CMOS gate array the basic cell 300 is comprised of the n-MOS transistor region 310, the p-MOS transistor region 320 and the bipolar transistor region 330. Namely, even if a logic circuit capable of operating at a high speed and consuming less power can be structured by Bi-CMOS gate arrays, the degree of integration is reduced due to the increase of the number of elements in the bipolar transistor region.

SUMMARY OF THE INVENTION

One object of the present invention is to reduce a plane area occupied by unit cells in a semiconductor integrated circuit device having unit cells combining regions for forming complementary field effect transistors and regions for forming bipolar transistors.

Another object of the present invention is to use partially in common a region for forming field effect transistors and a region for forming bipolar transistors in a semiconductor integrated circuit device having unit cells combining the regions for forming complementary field effect transistors and the regions for forming bipolar transistors.

A further object of the present invention is to isolate bipolar transistors from other field effect transistors formed in a region for forming field effect transistors and use the same in a semiconductor integrated circuit device having unit cells combining a region for forming complementary field effect transistors and regions for bipolar transistors.

A still further object of the present invention is to manufacture a semiconductor integrated circuit device having a unit cell combining a region for forming CFETs (complementary field effect transistor) and a region for forming bipolar transistors.

A still further object of the present invention is to manufacture a semiconductor integrated circuit device having a unit cell in which a region for forming CFETs and a region for forming bipolar transistors are used partially in common.

A semiconductor integrated circuit device according to one aspect of the present invention comprises a semiconductor substrate, a semiconductor layer of a first conductivity type, a semiconductor layer of a second conductivity type, first impurity regions of the first conductivity type, first impurity regions of the second conductivity type, a second impurity region of the second conductivity type, a second impurity region of the first conductivity type, first conductive layers, second conductive layers and third impurity regions. The semiconductor layer of the first conductivity type is formed on a major surface of the semiconductor substrate. The semiconductor layer of the second conductivity type is formed on the major surface of the semiconductor substrate. A plurality of the first impurity regions of the first conductivity type are formed spaced apart from each other extending in a first direction in the region of the semiconductor layer of the second conductivity type and have a predetermined width. A plurality of first impurity regions of the second conductivity type are formed spaced apart from each other extending in the first direction in the region of the semiconductor layer of the first conductivity type and have a predetermined width. The second impurity region of the second conductivity type is formed spaced apart from the first impurity regions of the first conductivity type and extends in the first direction in the region of the semiconductor layer of the second conductivity type. The second impurity region of the first conductivity type is formed spaced apart from the first impurity regions of the second conductivity type and extends in the first direction in the region of the semiconductor layer of the first conductivity type. A plurality of first conductive layers are formed spaced apart from each other in the first direction between the first impurity regions of the first conductivity type on the semiconductor layer of the second conductivity type through an insulation film. A plurality of second conductive layers are formed spaced apart from each other in the first direction between the first impurity regions of the second conductivity type on the semiconductor layer of the first conductivity type through an insulation film. A plurality of third impurity regions each are formed in each of the first impurity regions of one of the first and second conductivity types so as to have a conductivity type opposite to that of the first impurity regions. A region for forming each of FETs (field effect transistor) of the first conductivity type is formed of the first conductive layer as a gate and the first impurity regions of the first conductivity type disposed at the opposite sides of the gate as source and drain regions. A region for forming each of FETs of the second conductivity type is formed of the second conductive layer as a gate and the first impurity regions of the second conductivity type disposed at the opposite sides of the gate as source and drain regions. A region for forming each of bipolar transistors is formed of the third impurity region as an emitter region, the first impurity region of conductivity type as a base region and the second impurity region as a collector region formed in a region of a semiconductor layer in which the first impurity regions of the one conductivity type are disposed. The region for forming FETs of the first conductivity type, the region for forming FETs of the second conductivity type and the region for forming bipolar transistors constitute one unit cell.

A semiconductor integrated circuit device according to another aspect of the present invention comprises a semiconductor substrate, a semiconductor layer of a first conductivity type, a semiconductor layer of a second conductivity type, a plurality of first impurity regions of the first conductivity type, a plurality of first impurity regions of the second conductivity type, a second impurity region of the second conductivity type, a second impurity region of the first conductivity type, a plurality of first conductive layers, a plurality of second conductive layers, a plurality of third impurity regions of the second conductivity type and a plurality of third impurity diffusion regions of the first conductivity type. Each of the third impurity regions of the second conductivity type is formed in each of the first impurity regions of the first conductivity type. Each of the third impurity regions of the first conductivity type is formed in each of the first impurity regions of the second conductivity type. A region for forming each of first bipolar transistors is formed of the third impurity region of the second conductivity type as an emitter region, the first impurity region of the first conductivity type as a base region and the second impurity region of the second conductivity type as a collector region. A region for forming each of second bipolar transistors is formed of the third impurity region of the first conductivity type as an emitter region, the first impurity region of the second conductivity type as a base region and the second impurity region of the first conductivity type as a collector region. The region for forming FETs of the first conductivity type, the region for forming FETs of the second conductivity type, the region for forming first bipolar transistors and the region for forming second bipolar transistors constitute one unit cell.

A semiconductor integrated circuit device according to a further aspect of the present invention comprises a semiconductor substrate, a semiconductor layer of a first conductivity type, a semiconductor layer of a second conductivity type, a plurality of first impurity regions of the first conductivity type, a plurality of first impurity regions of the second conductivity type, a second impurity region of the second conductivity type, a second impurity region of the first conductivity type, a plurality of first conductive layers, a plurality of second conductive layers and a plurality of third impurity regions. Each of third impurity regions is formed in each of the first impurity region of one of the first and second conductivity types so as to have a conductivity type opposite to that of the first impurity region. A region for forming FETs of the first conductivity type and a region for forming FETs of the second conductivity type are formed in the same manner as described above. A region for forming each of bipolar transistors is formed of the third impurity region as an emitter region, the first impurity region of the one conductivity type as a base region and the second impurity region as a collector region formed in a region of a semiconductor layer in which the first impurity regions of the one conductivity type are disposed. The region for forming FETs of the first conductivity type, the region for forming FETs of the second conductivity type and the region for forming bipolar transistors constitute one unit cell. By holding gates disposed at the opposite sides of the base region at a first potential, the base region is isolated electrically from other base regions adjacent through gates in the first direction. By holding a gate disposed between source and drain regions at a second potential, the field effect transistor is rendered active.

According to a method of manufacturing a semiconductor integrated circuit device according to the present invention, a semiconductor layer of a first conductivity type and a semiconductor layer of a second conductivity type are first formed on a major surface of a semiconductor substrate. A plurality of first conductive layers are formed spaced apart from each other in a first direction on the semiconductor layer of the second conductivity type through an insulation film. A plurality of second conductive layers are formed spaced apart from each other in the first direction on the semiconductor layer of the first conductivity type through an insulation film. A plurality of first impurity regions of the first conductivity type are formed spaced apart from each other extending in the first direction between the first conductive layers in the region of the semiconductor layer of the second conductivity type so as to have a predetermined width. A second impurity region of the first conductivity type is formed in the region of the semiconductor layer of the first conductivity type so as to extend in the first direction. A plurality of first impurity regions of the second conductivity type are formed spaced apart from the second impurity region of the first conductivity type in the region of the semiconductor layer of the first conductivity type so as to extend spaced apart from each other in the first direction between the second conductive layers and have a predetermined width. A second impurity region of the second conductivity type is formed spaced apart from the first impurity regions of the first conductivity type in the region of the semiconductor layer of the second conductivity type so as to extend in the first direction. Each of third impurity regions is formed in the first impurity region of one of the first and second conductivity types so as to have a conductivity type opposite to that of the first impurity region.

In the present invention, an impurity region as source or drain region disposed between gates in a region for forming FETs is also used as a base region of a region for forming bipolar transistors. In addition, an emitter region in a region for forming bipolar transistors is provided in a base region used also as source or drain region. Therefore, the region for forming FETs and the region for forming bipolar transistors are formed to be used partially in common. Accordingly, as a unit cell is structured by combining the region for forming FETs and the region for forming bipolar transistors, there is no need to provide a region for forming bipolar transistors separated from a region for forming FETs. As a result, an area occupied by a unit cell comprising the region for forming bipolar transistors and the region for forming FETs can be reduced. This enables a semiconductor integrated circuit device having unit cells integrated in array to be more highly integrated.

In addition, in the present invention, impurity regions disposed between gates are used in common as source or drain region and a base region. If this impurity region is used as a base region, by holding gates disposed at the opposite sides of the base region at the first potential, field effect transistors structured by these gates can be maintained in an offset. As a result, the impurity region used as a base region of the region for forming bipolar transistors can be isolated electrically from other impurity regions adjacent thereto through gates. On the other hand, when the impurity region is used as source or drain region of the field effect transistor, by holding a gate disposed between the two impurity regions at a second potential, the field effect transistor structured by the two impurity regions and the gate can be turned on.

Although the present invention has been described and illustrated in detail, it is clearly understood that the same is by way of illustration and example only and is not to be taken by way of limitation, the spirit and scope of the present invention being limited only by the terms of the appended claims.

BRIEF DESCRIPTION OF THE DRAWINGS

FIG. 3B is a plan view showing a structure of a basic cell of a Bi-CMOS gate array according to one embodiment of the present invention.

FIG. 3C is a plan view showing a structure of a basic cell of a Bi-CMOS gate array according to another embodiment of the present invention.

FIG. 4A is a plan view showing a structure of a basic cell of a Bi-CMOS gate array as another example to be compared with the present invention.

FIG. 4B is a plan view showing a structure of a basic cell of a Bi-CMOS gate array according to a further embodiment of the present invention.

FIG. 14A is a plan view showing a interconnection pattern in accordance with which a still further two-input NAND circuit is structured by the basic cell of the Bi-CMOS gate array shown in FIG. 3C.

FIG. 19A is a plan view showing a structure of a basic array of a Bi-CMOS gate array for use to structure an inverter circuit or the like as an embodiment according to another aspect of the present invention.

FIG. 19B is a plan view showing a structure of a basic cell of a Bi-CMOS gate array for use to structure an inverter circuit or the like as another embodiment according to a further aspect of the present invention.

DESCRIPTION OF THE PREFERRED EMBODIMENTS

Figure 1:
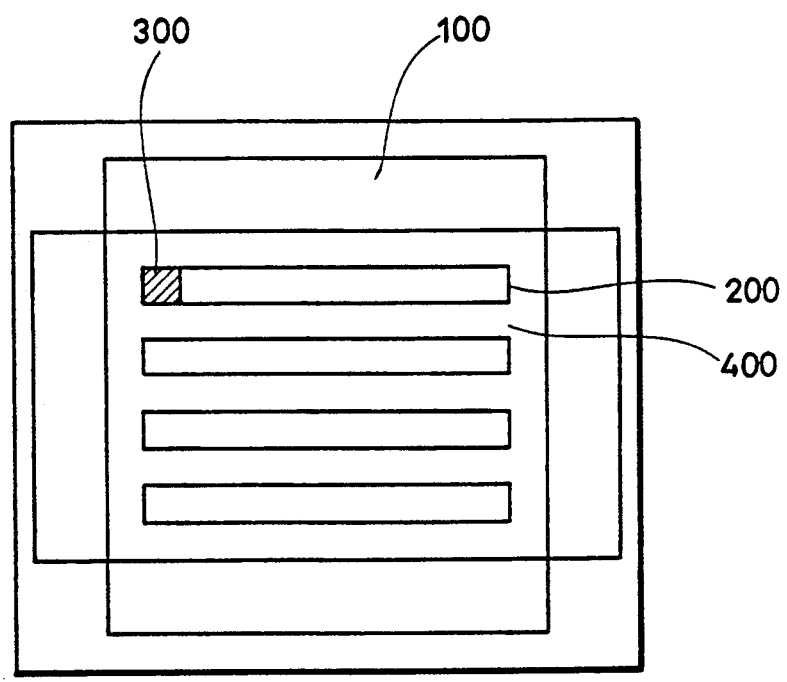
FIG. 1 is a plan view showing a schematic structure of a conventional gate array chip.
Figure 2A:
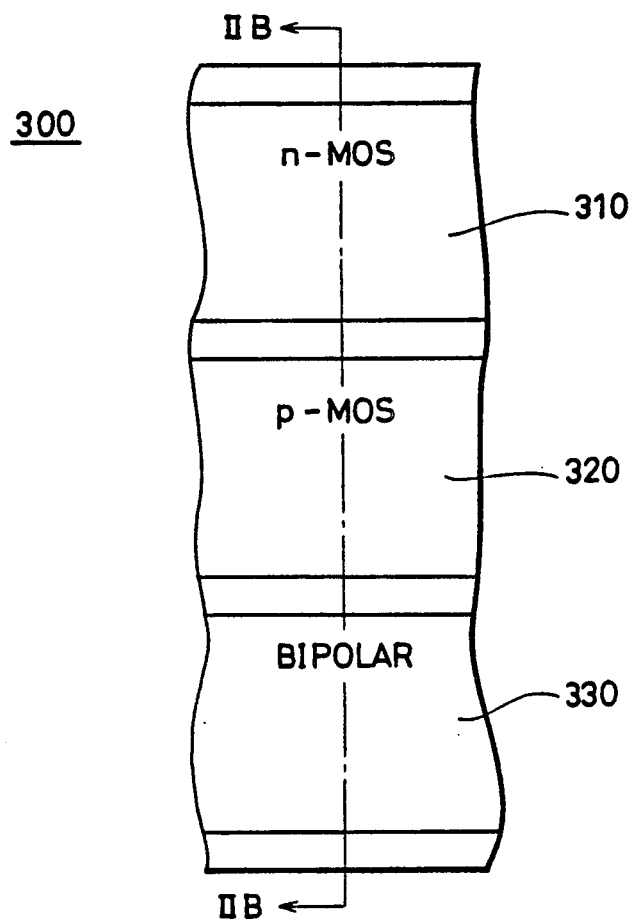
FIG. 2A is a partial plan view showing a part of a basic cell of a conventional Bi-CMOS gate array.
Figure 2B:
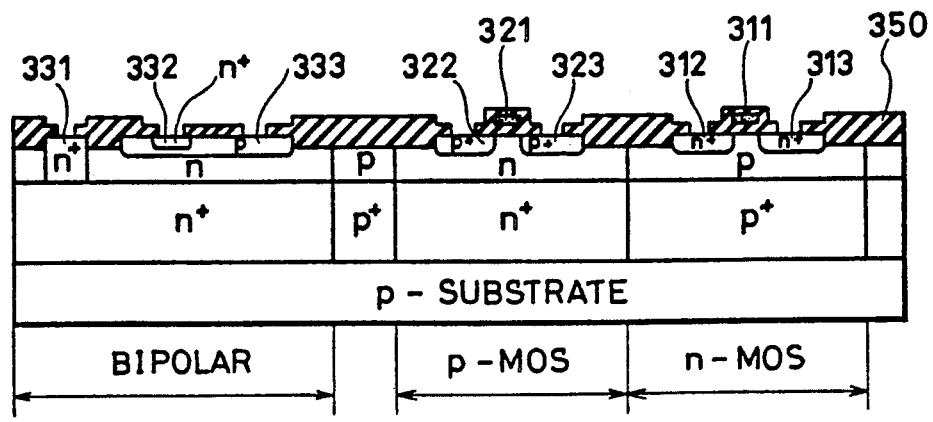
FIG. 2B is a sectional view taken along a line IIB—IIB of FIG. 2A.
Figure 3A:
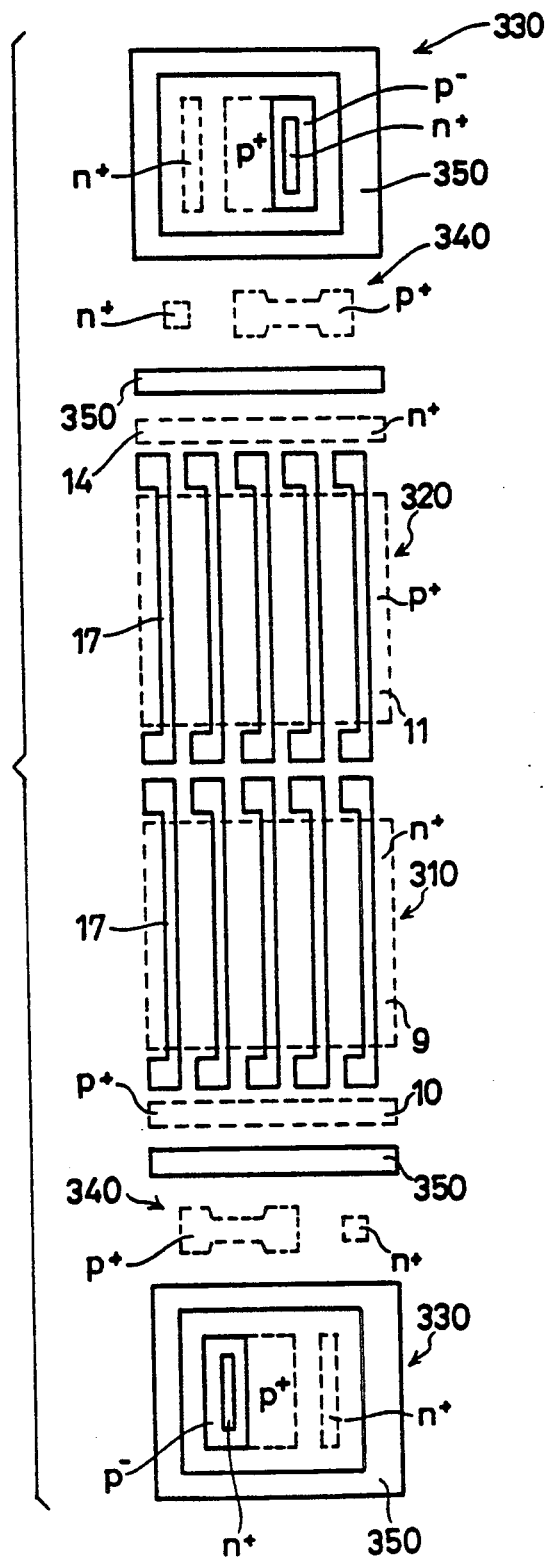
FIG. 3A is a plan view showing a structure of a basic cell of a Bi-CMOS gate array as an example to be compared with the present invention.

FIG. 3A is a plan view showing a structure of a basic cell of a Bi-CMOS gate array on the analogy of the basic cell of the conventional Bi-CMOS gate array shown in FIGS. 2A and 2B. Referring to FIG. 3A, bipolar transistor regions 330 are formed on the opposite outer sides of an n-MOS and p-MOS transistor regions 310 and 320. Isolation regions 350 are respectively formed between each of the bipolar transistor regions 330 and the MOS transistor region 310 or 320. The insulation regions 350 are formed on the periphery of the bipolar transistors 330. Regions 340 for forming resistances are formed between each of the bipolar transistor regions 330 and the MOS transistor region 310 or 320 respectively. The p-MOS transistor region 320 is comprised of a plurality of gate electrodes 17 aligned laterally and p+ impurity diffusion layers 11 as source/-drain regions formed on opposite sides of each gate electrode 17 in the drawing. The n-MOS transistor region 310 is, in the same manner, comprised of a plurality of gate electrodes 17 aligned laterally and n+impurity diffusion layers 9 as source/drain regions formed on the opposite sides of each gate electrode 17. As the foregoing, in the example to be compared with the present invention on the analogy of the structure of the basic cell of the conventional Bi-CMOS gate array, the bipolar transistor region is formed separately in a region separated from the MOS transistor regions.

On the contrary, in the basic cell of the Bi-CMOS gate array according to one embodiment of the present invention shown in FIG. 3B, a region 361 for forming an npn bipolar transistor is incorporated in the p-MOS transistor region 320. Also in this embodiment, a bipolar transistor region 330 is formed separately in a region isolated from the n-MOS transistor region 310 through the isolation region 350. The p-MOS transistor region 320 is comprised of a plurality of gate electrodes 17 aligned laterally and the p+ impurity diffusion layers 11 as source/drain regions formed on the opposite sides of each gate electrode 17 in the drawing. In addition, the region 361 for forming npn bipolar transistors which is incorporated in the p-MOS transistor region uses the p+ impurity diffusion layer 11 as a base-contact region and is comprised of a p− impurity diffusion layer 12 as a base region in contact with the base-contact region, an n+impurity diffusion layer 13 as an emitter region formed in the p− impurity diffusion layer 12 and an n+ impurity diffusion layer 14 as a collector region. Here, the p+impurity diffusion layer 11 for use as the source/-drain region of the p-MOS transistor region 320 also serves as a base-contact region of the region 361 for forming npn bipolar transistors. The n+ impurity diffusion layer 14 is used as a region for taking out the potential of the substrate in the p-MOS transistor region. The p+impurity diffusion layer 10 is used as a region for taking out the potential of the substrate in the n-MOS transistor region 310. As the foregoing, it will be appreciated that the basic cell of the Bi-CMOS gate array shown in FIG. 3B allows a plane area occupied by the basic cell to be reduced as compared with that of FIG. 3A.

Figure 3D:
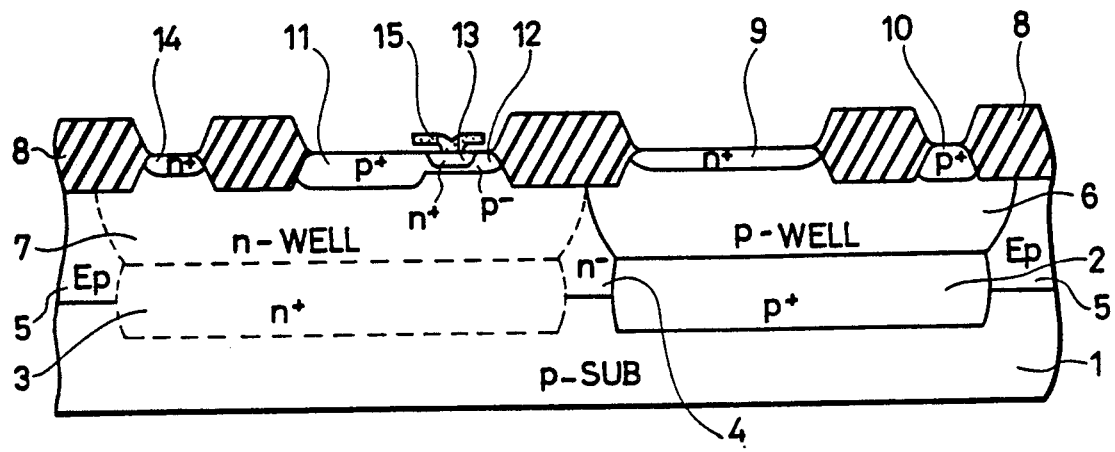
FIG. 3D is a partial sectional view taken along a line IIID—IIID of FIG. 3B.
Figure 3E:
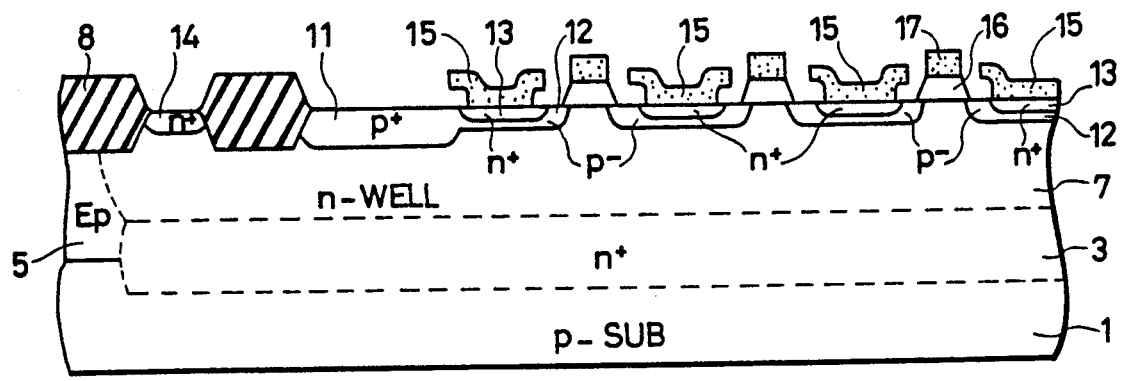
FIG. 3E is a partial sectional view taken along a line IIIE—IIIE of FIG. 3B.

Referring to FIGS. 3D and 3E, the MOS transistor regions 310 and 320 arranged in FIG. 3A and the region 361 for forming the npn bipolar transistors are formed on a p type silicon substrate 1. A p+ buried layer 2 and an n+buried layer 3 are formed spaced apart on the p type silicon substrate 1. A p-well layer 6 and an n-well layer 7 are formed on the p+ buried layer 2 and the n+ buried layer 3 respectively. n− epitaxial layers 4 and 5 are formed below and thick isolation oxide films 8 are formed above the regions between the respective well layers 6 and 7. An n+impurity diffusion layer 9 and a p+ impurity diffusion layer 10 are formed spaced apart from each other in the region of the p-well layer 6. A p+impurity diffusion layer 11 and an n+ impurity diffusion layer 14 are formed spaced apart from each other in the region of the n-well layer 7. A p− impurity diffusion layer 12 is formed extending in contact with the p+ impurity diffusion layer 11. An n+impurity diffusion layer 13 is formed in the region of the p− impurity diffusion layer 12. An electrode 15 for emitter of polycrystalline silicon is formed so as to be in contact with the surface of the n+impurity diffusion layer 13. A gate electrode 17 of polycrystalline silicon is formed on the n-well layer 7 through gate oxide films 16 between the p+ impurity diffusion layers 11.

FIG. 3C shows another embodiment in which a plane area occupied by basic cells in a Bi-CMOS gate array is further reduced. Referring to FIG. 3C, the region 361 for forming npn bipolar transistors is incorporated in the p-MOS transistor region 320 and a region 362 for forming pnp bipolar transistors is incorporated in the n-MOS transistor region 310. This is directed to a further reduction of the plane area occupied by the basic cells as compared with the basic cells shown in FIG. 3B. The n-MOS transistor region 310 is comprised of the plurality of gate electrodes 17 formed laterally spaced apart by a predetermined distance laterally and the n+ impurity diffusion layers 9 formed on the opposite sides of each gate electrode 17 as source/drain region. The region 362 for forming pnp bipolar transistors incorporated in the n-MOS transistor region 310 is structured by the n+impurity diffusion layer 9 as a base region, a p++impurity diffusion layer 18 as an emitter region formed in the base region and a p+ impurity diffusion layer 10 as a collector region. Here the n+ impurity diffusion layer 9 for use as the source/drain region of the n-MOS transistor region 310 also serves as a base region of the region 362 for forming pnp bipolar transistors. In addition, the p+impurity diffusion layer 10 for use as a region for taking out the potential of substrate in the n-MOS transistor region 310 also serves as a collector region of the region 362 for forming pnp bipolar transistors. As the foregoing, a plane area occupied by the basic cells is further reduced as compared with the basic cell of the conventional Bi-CMOS gate array.

Figure 3F:
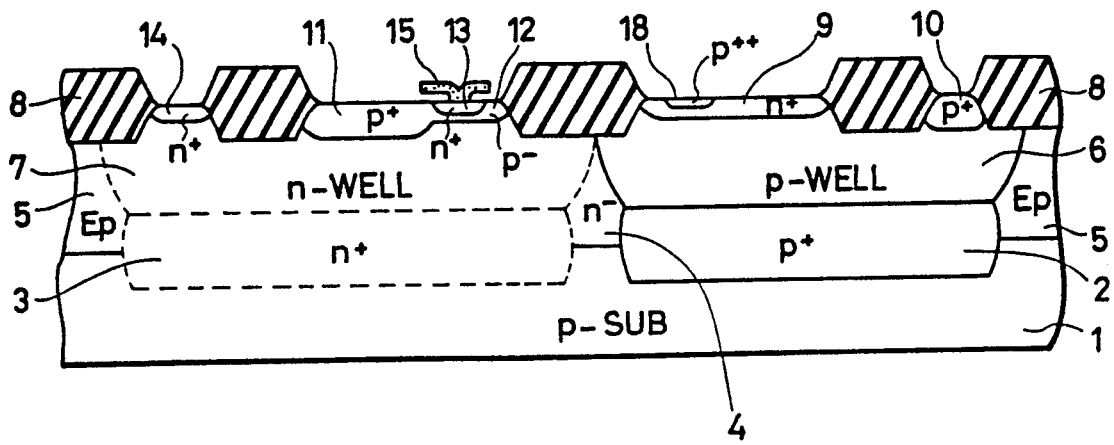
FIG. 3F is a partial sectional view taken along a line IIIF—IIIF of FIG. 3C.

Referring to FIG. 3F, in the drawing, the p-MOS transistor region shown in the left half is the same as that of FIG. 3D. The n+ impurity diffusion layer 9 as the source/drain region of the n-MOS transistor region 310 is formed in the region of the p-well layer 6. The P++impurity diffusion layer 18 is formed in the n+ impurity diffusion layer 9.

As another example to be compared with the present invention is on the analogy of the basic cell of the conventional Bi-CMOS gate array shown in FIGS. 2A and 2B, FIG. 4A shows a basic cell in which two n+impurity diffusion layers 9a and 9b are formed in the n-MOS transistor region 310 and the gate electrodes 17 are shared by the two n+ impurity diffusion layers 9a and 9b. Applying the present invention to such an example to be compared, incorporation of the region 361 for forming npn bipolar transistors into the p-MOS transistor region 320 enables reduction of the plane area occupied by basic cells, as shown in FIG. 4B.

Now description will be given of an example of an interconnection pattern of a logic circuit structured by the basic cell of the above described Bi-CMOS gate array of each embodiment.

Figure 5A:
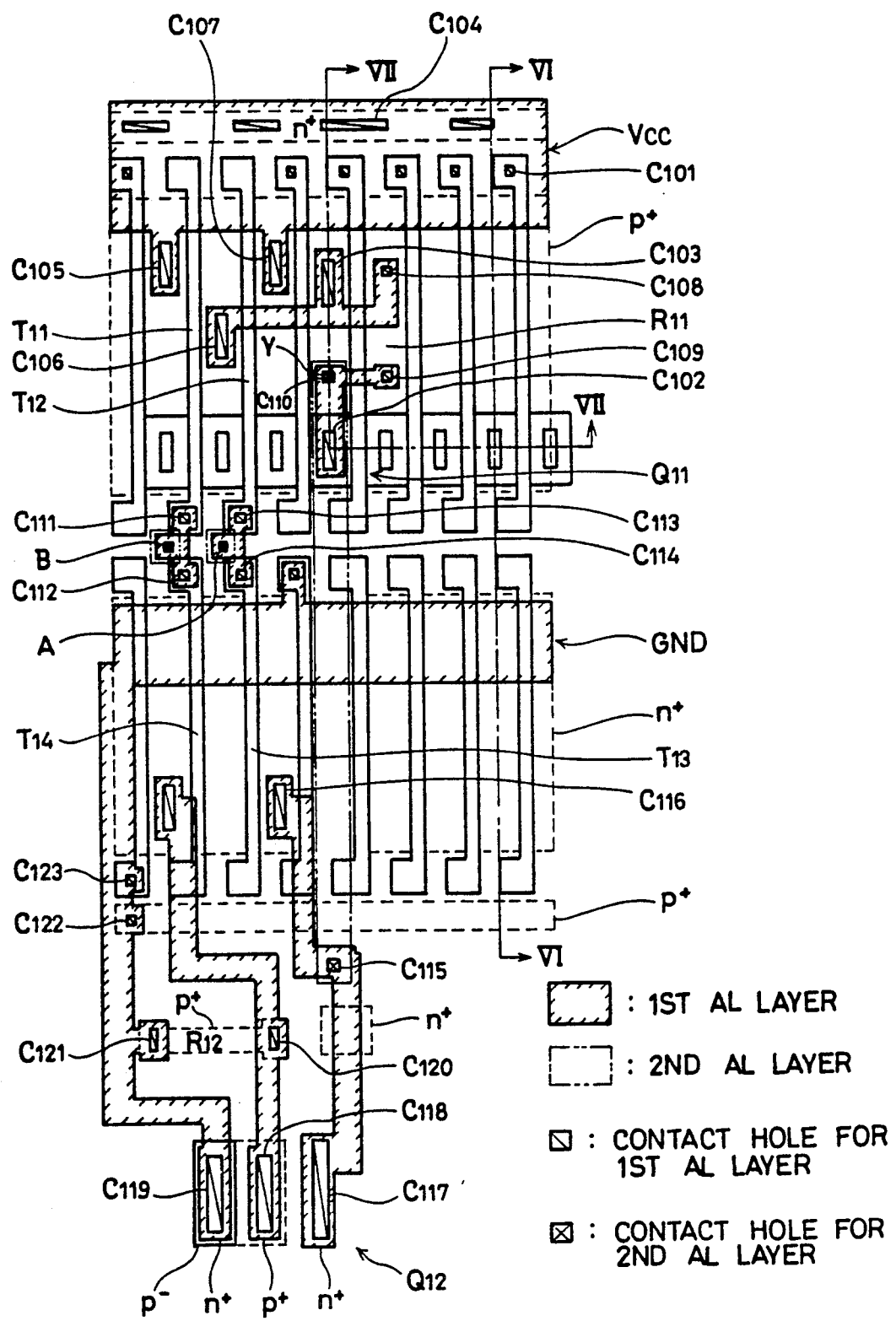
FIG. 5A is a plan view showing an interconnection pattern in accordance with which a two-input NAND circuit is structured by the basic cell of the Bi-CMOS gate array shown in FIG. 3B.
Figure 5B:
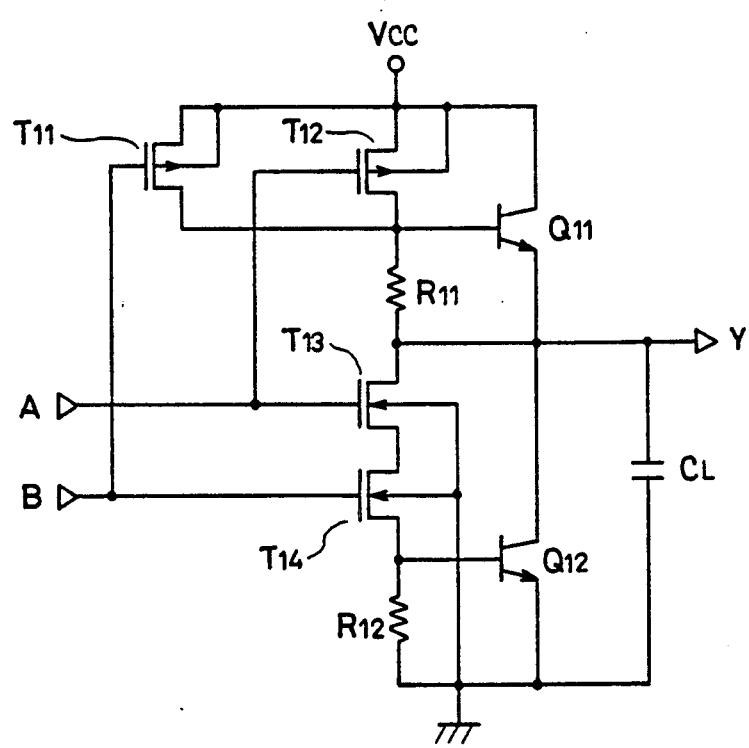
FIG. 5B is a circuit diagram of the two-input NAND circuit shown in FIG. 5A.

Described is an embodiment of an interconnection pattern (FIG. 5A) in accordance with which the two-input NAND circuit shown in FIG. 5B is structured by the basic cell of FIG. 3B. Referring to FIG. 5B, an input terminal A is connected to a gate of a p-MOS transistor T12 and an input terminal B is connected to a gate of a p-MOS transistor T11. In addition, the input terminal A is connected to a gate of an n-MOS transistor T13 and the input terminal B is connected to a gate of an n-MOS transistor T14.

The p-MOS transistors T11 and T12 are connected to a power supply (voltage Vcc) with each source and substrate thereof connected with each other. The p-MOS transistors T11 and T12 are connected to a collector of a bipolar transistor Q11 with each source and substrate thereof connected to each other. Respective drains of the p-MOS transistors T11 and T12 are connected to each other, which is further connected to a base of the bipolar transistor Q11. The respective drains of the p-MOS transistors T11 and T12 are connected to a drain of the n-MOS transistor T13 through a resistance R11.

A source of the n-MOS transistor T13 and a drain of the n-MOS transistor T14 are connected to each other. An intermediate point between the drain of the n-MOS transistor T13 and the resistance R11 is connected to an emitter of the bipolar transistor Q11, a collector of the bipolar transistor Q12 and also to an output terminal Y. A source of the n-MOS transistor 14 is connected to a base of the bipolar transistor Q12 and is grounded through a resistance R12 together with the substrates of the n-MOS transistors T13 and T14 and an emitter of the bipolar transistor Q12. An elastic load capacitance CL is formed between the output terminal Y and a ground point.

In such a two-input NAND gate circuit, when the input terminals A and B, or A or B is at a potential of a low level (ground potential), both of the n-MOS transistors T13 and T14 or either one of them is turned off and the bipolar transistor Q12 is turned off because the base thereof is grounded through the resistance R12.

On the other hand, both or one of the p-MOS transistors T11 and T12 is turned on, and a signal having a high level potential (corresponding to Vcc) is outputted from the output terminal Y. The bipolar transistor Q11 is turned on when the potential of the output terminal Y is between the ground potential and Vcc-$V_{BE}$(Q11) and turned off when the potential is above Vcc-$V_{BE}$(Q11). $V_{BE}$(Q11) denotes a base-emitter forward voltage of the bipolar transistor Q11.

When potentials of the input terminals A and B attain the high level after these states, all of the p-MOS transistors T11 and T12 and the bipolar transistor Q11 are turned off. Furthermore, the n-MOS transistors T13 and T14 are turned on, so that electric charges of the load capacitance CL are drawn out, thereby causing a current to flow toward the resistance R12. This causes a base voltage of the bipolar transistor Q12 to rise to enter an on state.

When the bipolar transistor Q12 is turned on, the electric charges of the load capacitance CL are abruptly drawn out, thereby lowering the potential of the output terminal Y. The bipolar transistor Q12 is turned on when the potential of the output terminal Y exceeds the $V_{BE}$(Q12) which is the base-emitter forward voltage of the bipolar transistor Q12 and turned off when the potential is less than the $V_{BE}$. The electric charges of the load capacitance CL are discharged in accordance with values of the on-resistance of the n-MOS transistors T13 and T14 and the resistance R12.

Accordingly, in the two-input NAND circuit using the Bi-CMOS gates, the bipolar transistors Q11 and Q12 are turned on only in a transitional period when the output of the logic circuit is being changed, so that the electric charges of the load capacitance CL are discharged at a high speed. In a normal state, since bipolar transistors Q11 and Q12 are in the off state, none of the unnecessary current flows, so that a current consumption as low as that of a CMOS gate is maintained and an operation at a speed several times as fast as that of the CMOS gate with respect to the output load capacitance will be possible.

FIG. 5A shows an example of an interconnection pattern in accordance with which such a two-input NAND circuit is structured by using the basic cell of the Bi-CMOS gate array of FIG. 3B. Referring to FIG. 5A, the bipolar transistor Q11 and the resistance R11 are formed in a region in which the p-MOS transistors T11 and T12 are formed. The input terminal B is connected to the gates of the p-MOS transistor T11 and the n-MOS transistor T14 in parallel through contact holes C111 and C112, respectively. The input terminal A is connected to the gates of the p-MOS transistor T12 and the n-MOS transistor T13 in parallel through contact holes C113 and C114 respectively.

The respective sources of the p-MOS transistors T11 and T12 are connected to the power supply (voltage Vcc) through contact holes C105 and C107. The n+ impurity diffusion layer as the region for taking out the potential of substrate in the p-MOS transistors T11 and T12 is connected to the power supply through a contact hole C104, thereby connecting the collector of the bipolar transistor Q11 to the power supply. The drains of the p-MOS transistors T11 and T12 use the same impurity diffusion layer, and connected to the base of the bipolar transistor Q11 through contact holes C106 and C103. In addition, the drains of the p-MOS transistors T11 and T12 are connected to the resistance R11 through a contact hole C108. The resistance R11 is connected to the emitter of the bipolar transistor Q11 through contact holes C109 and C102. A first aluminum layer for this connection is connected to a second aluminum layer through a contact hole C110. The second aluminum layer is connected to another first aluminum layer through a contact hole C115. The first aluminum layer is connected to the drain of the n-MOS transistor T13 through a contact hole C116.

On the other hand, the drain of the n-MOS transistor T13 is connected to the collector of the bipolar transistor Q12 through a contact hole C117. The output terminal Y is provided in the second aluminum layer for the above described connection. The source of the n-MOS transistor T14 is connected to the base of the bipolar transistor Q12 through a contact hole C118. The source of the n-MOS transistor T14 is connected to the resistance R12 through a contact hole C120. The resistance R12 is connected to the p+ impurity diffusion layer as the region for taking out the potential of substrate in the n-MOS transistors T13 and T14 through contact holes C121 and C122 and is also grounded. The emitter of the bipolar transistor Q12 is connected to a ground potential (GND) through a contact hole C119.

Figure 6:
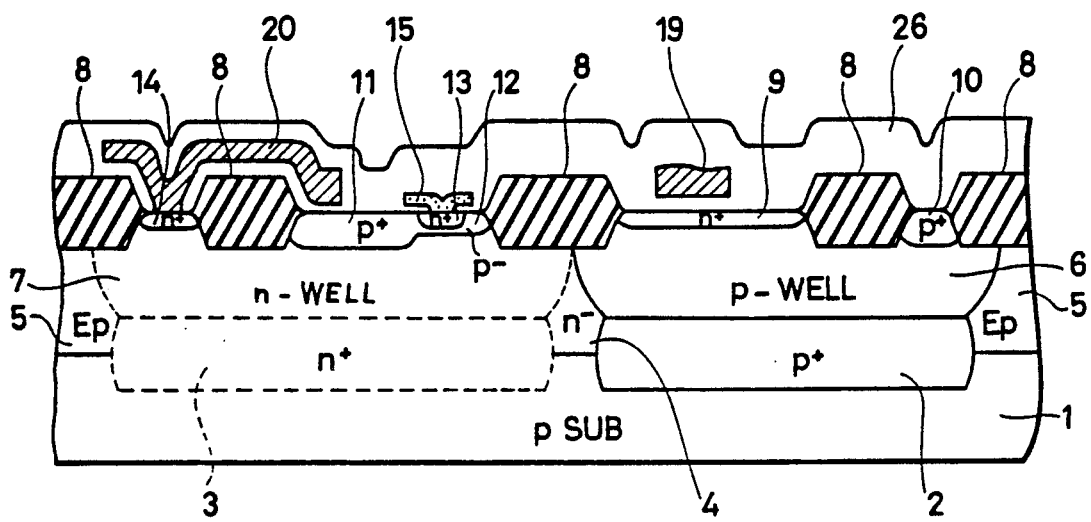
FIG. 6 is a partial sectional view taken along a line VI—VI of FIG. 5A.
Figure 7:
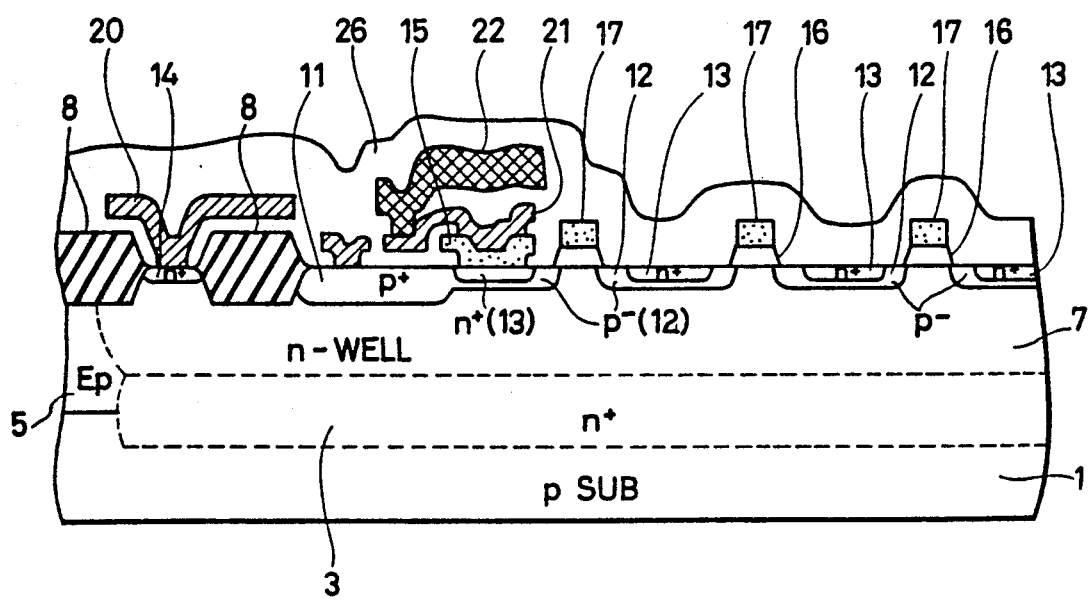
FIG. 7 is a partial sectional view taken along a line VII—VII of FIG. 5A.

Referring to FIGS. 6 and 7, $p^-$ impurity diffusions layer 12 for use as base regions of the bipolar transistor Q11 are formed so as to be in contact with a source or a drain of each p-MOS transistor. An n+ impurity diffusion layer 13 for use as the emitter of the bipolar transistor Q11 is formed in each $p^-$ impurity diffusion layer 12. The collector of the bipolar transistor Q11 is also used for an n+ impurity diffusion layer 14 as a region for taking out the potential of substrate in each p-MOS transistor. The n+ impurity diffusion layer 14 is held at the power supply potential Vcc because a first aluminum interconnection layer 20 is connected t the surface of the layer 14. An electrode 15 for emitter formed of polycrystalline silicon is provided so as to be in contact with an n+ impurity diffusion layer 12 for use as the emitter of the bipolar transistor Q11. A first aluminum interconnection layer 21 and a second aluminum interconnection layer 22 are connected to the electrode 15 for emitter.

When the bipolar transistor Q11 is used, the gate electrodes 17 disposed at the opposite sides of the $p^-$ impurity diffusion layer 12 as the base region of the bipolar transistor Q11 are connected to the power supply (potential Vcc) through the contact hole C101 (referred to FIG. 5A) and the first aluminum interconnection layer 20. This causes the p-MOS transistors disposed at the opposite sides of the base region to function as off-transistors. Accordingly, the $p^-$ impurity diffusion layer 12 for use as the base region of the bipolar transistor Q11 is electrically isolated from other $p^-$ impurity diffusion layers 12 adjacent thereto through the gate electrodes 17.

At the resistance R11, by connecting the gate electrodes 17 at the opposite sides of the p+ impurity diffusion layer 11 for forming a resistance to the power supply (potential Vcc) through the contact hole C101, as in case of the bipolar transistor Q11, the p+ impurity diffusion layers 12 function as resistances. The respective interconnection layers are covered with an insulation layer 26.

On the other hand, also in an n-MOS transistor region, as shown in FIG. 6, an n+ impurity diffusion layer 9 as a source or a drain region of the n-MOS transistor is formed between isolation oxide films 8. A p+impurity diffusion layer 10 as a region for taking out the potential of substrate in the n-MOS transistor is formed so as to contact with a p-well layer 6. An aluminum interconnection layer 19 held at the ground potential is formed above the n+ impurity diffusion layer 9 through the insulation layer 26.

Figure 8A:
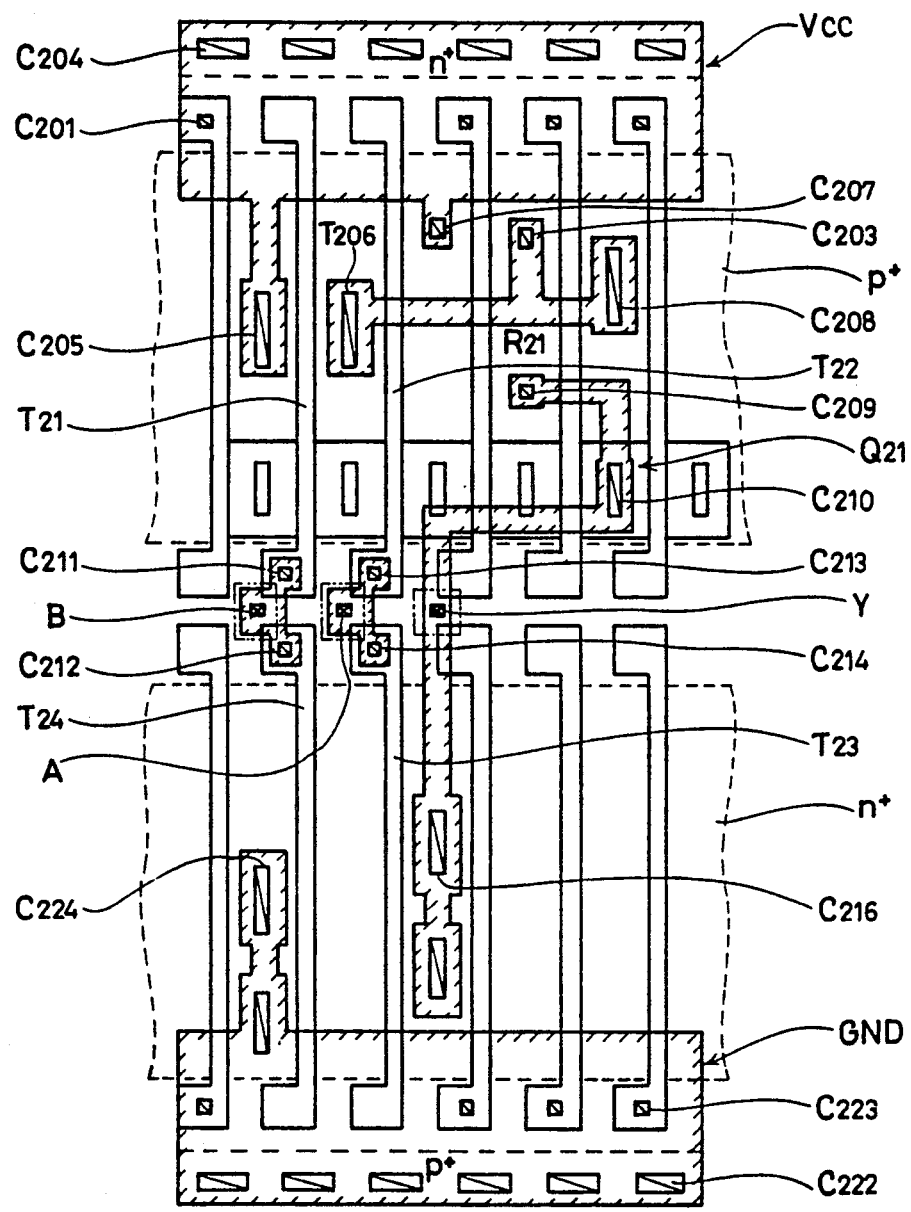
FIG. 8A is a plan view showing an interconnection pattern in accordance with which another two-input NAND circuit is structured by the basic cell of the Bi-CMOS gate array shown in FIG. 3B.
Figure 8B:
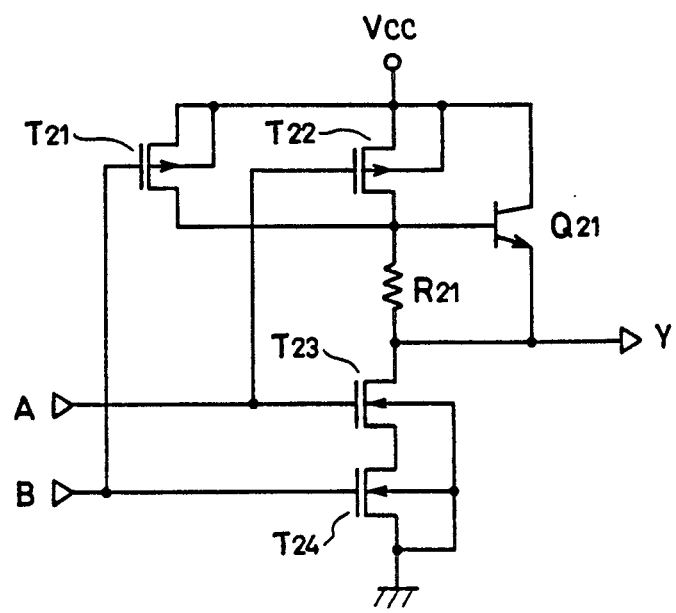
FIG. 8B is a circuit diagram of the two-input NAND circuit shown in FIG. 8A.

Referring to FIG. 8A, an interconnection pattern in accordance with which the circuit shown in FIG. 8B is structured by using the basic cells of FIG. 3B is shown as a variation of an two-input NAND circuit. In this embodiment, shown is a case where the region of the bipolar transistor Q12 and the region of the resistance R12 are omitted from the interconnection pattern shown in FIG. 5A. As is clear from the comparison of FIG. 8B and 5B, the circuit shown in FIG. 8B has a structure of the circuit of FIG. 5B without the bipolar transistor Q12 and the resistance R12. Drivability of the two-input NAND circuit shown in FIG. 8B, with respect to a load capacitance becomes relatively small. However, by structuring the circuit using the basic cells of the Bi-CMOS gate array of FIG. 3B, a plane area occupied by the basic cell can be reduced down to approximately the same as the basic cell of the CMOS gate array.

The rest of the structure is substantially the same as that of the embodiment shown in FIG. 5A and the same representations or numerals are allotted to the corresponding portions and therefore no description thereof will be given.

Figure 9A:
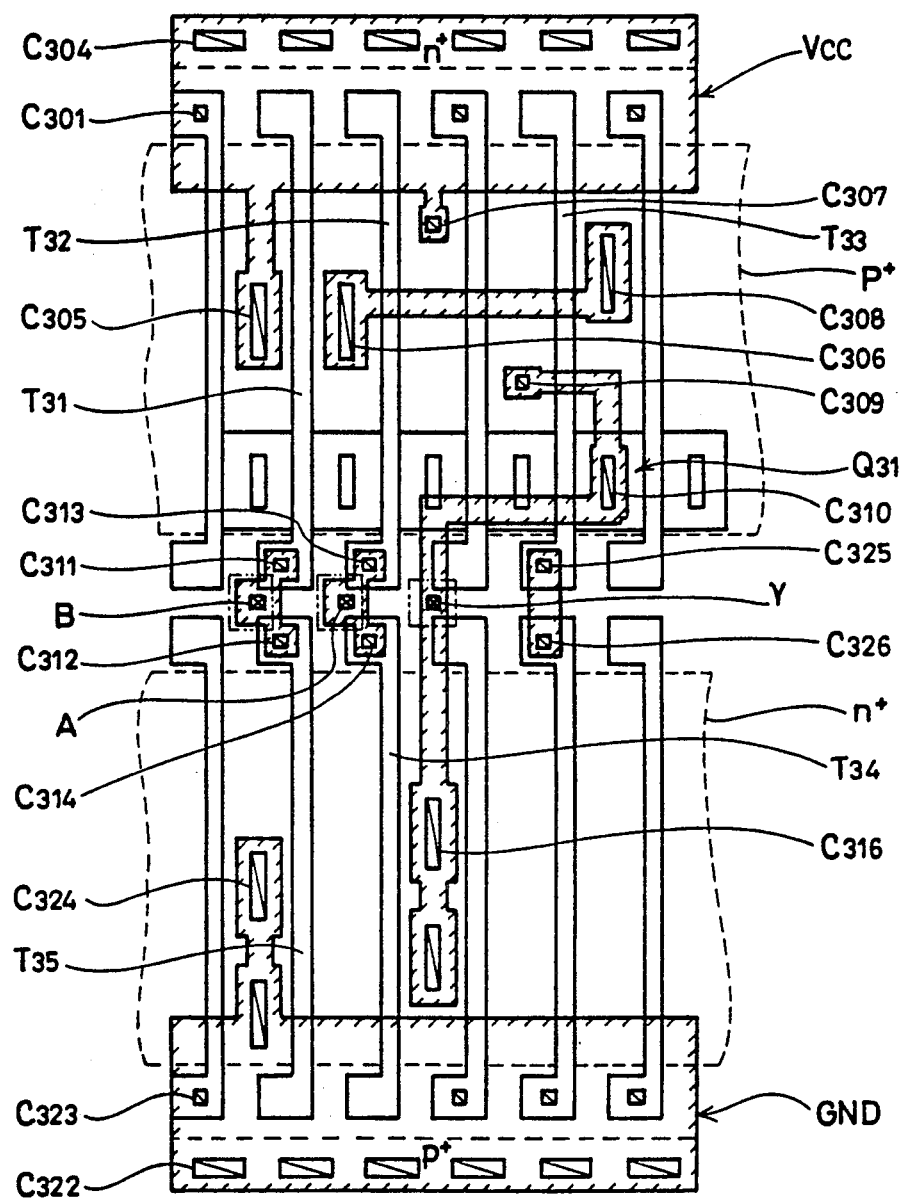
FIG. 9A is a plan view showing an interconnection pattern in accordance with which a further two-input NAND circuit is structured by the basic cell of the Bi-CMOS gate array shown in FIG. 3B.
Figure 9B:
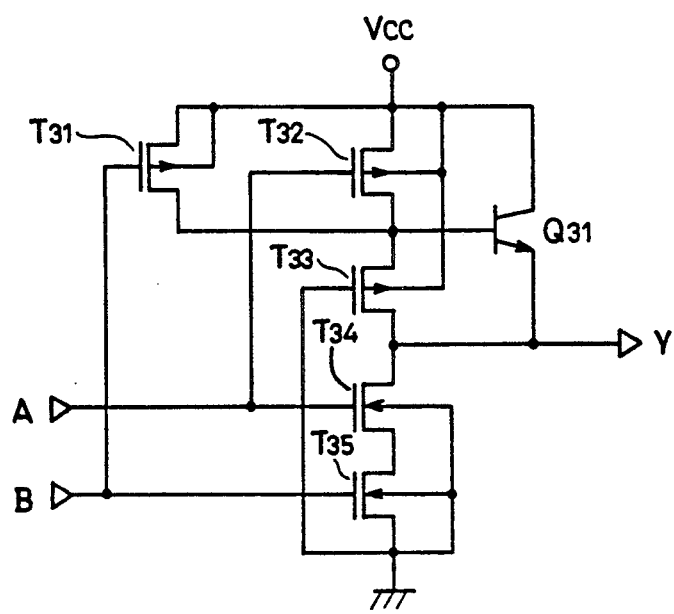
FIG. 9B is a circuit diagram of the two-input NAND circuit shown in FIG. 9A.

FIG. 9A shows an interconnection pattern in accordance with which another two-input NAND circuit (FIG. 9B) is structured by the basic cells of FIG. 3B. In this embodiment, the resistance R21 in the embodiment shown in FIGS. 8A and 8B is replaced by a p-MOS transistor T33 for use as an on transistor. The rest of the structure is substantially the same as that of the embodiment shown in FIGS. 8A and 8B and the same representations or numerals are allotted to the corresponding portions and therefore no description thereof will be given.

Figure 10:
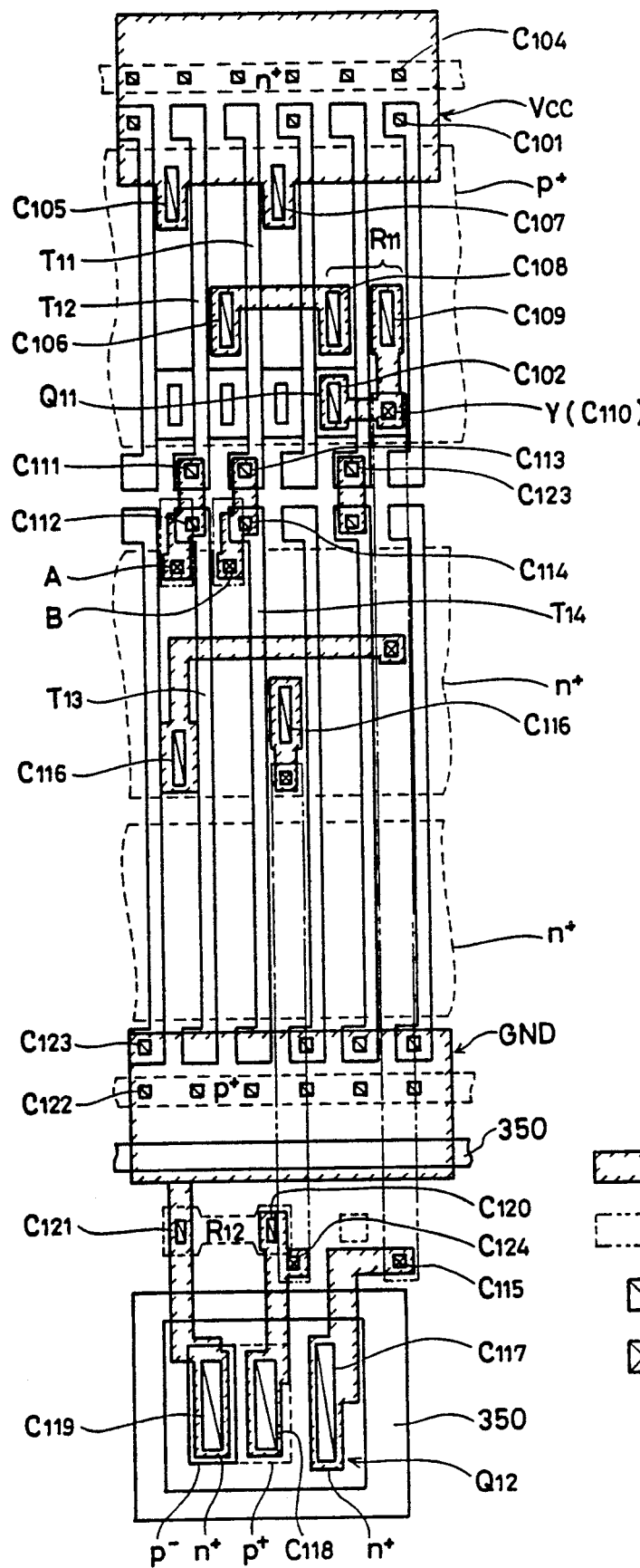
FIG. 10 is a plan view showing an interconnection pattern in accordance with which the two-input NAND circuit shown in FIG. 5B is structured by the basic cell of the Bi-CMOS gate array shown in FIG. 4B.

FIG. 10 shows an interconnection pattern in accordance with which the two-input NAND circuit of FIG. 5B is structured by the basic cells of FIG. 4B. In this embodiment, the resistance R11 in the embodiment shown in FIGS. 5A and 5B is structured by p-MOS transistors for use as on-transistors. The rest of the structure is substantially the same as that of the embodiment shown in FIGS. 5A and 5B and the same representations or numerals are allotted to the corresponding portions and therefore no description thereof will be given.

Figure 11A:
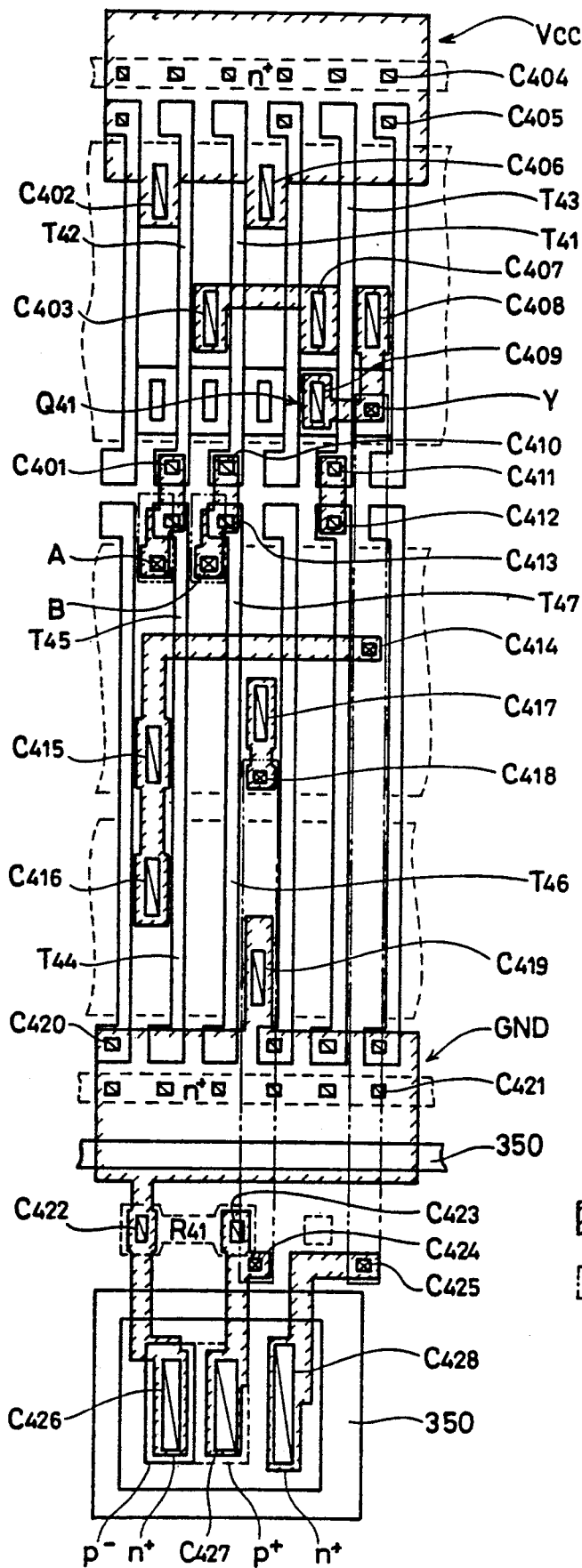
FIG. 11A is a plan view showing an interconnection pattern in accordance with which a still further two-input NAND circuit is structured by the basic cell of the Bi-CMOS gate array shown in FIG. 4B.
Figure 11B:
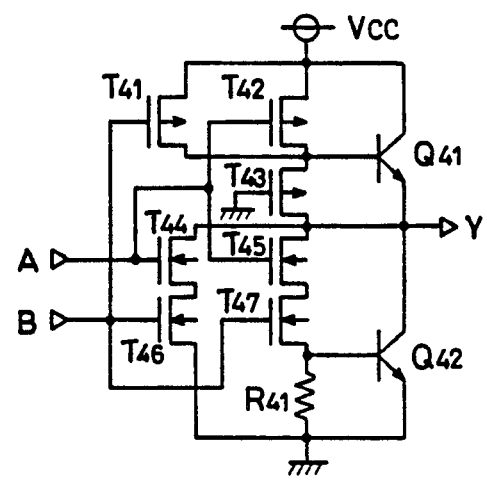
FIG. 11B is a circuit diagram of the two-input NAND circuit shown in FIG. 11A.

FIG. 11A is a plan view showing an interconnection pattern in accordance with which still another variation of a two-input NAND circuit (FIG. 11B) is structured by the basic cell of FIG. 4B. As is clear from the comparison of FIG. 5B and FIG. 12B, in the circuit of FIG. 12B, the resistance R11 in the embodiment shown in FIG. 5B is replaced by a p-MOS transistor T43 for use as an on-transistor and two more n-MOS transistors are provided. This allows an n-MOS transistor connected to the ground potential to be effective during an initial stage of the switching when an output voltage is still high and an closing stage of the switching when the output voltage becomes low, thereby compensating for a period when a bipolar transistor is unlikely to be effective. Therefore, an operation rate can be enhanced during a fall of the output voltage.

The rest of the structure shown in FIG. 11A is substantially the same as that of the embodiment shown in FIG. 10 and the same numerals or representations are allotted to the corresponding portions and therefore no description thereof will be given. FIG. 11A defers from FIG. 10 in that in FIG. 11A n-MOS transistors T44 and T45, and T46 and T47 each having a shared gate are provided in n-MOS transistor regions.

Figure 12A:
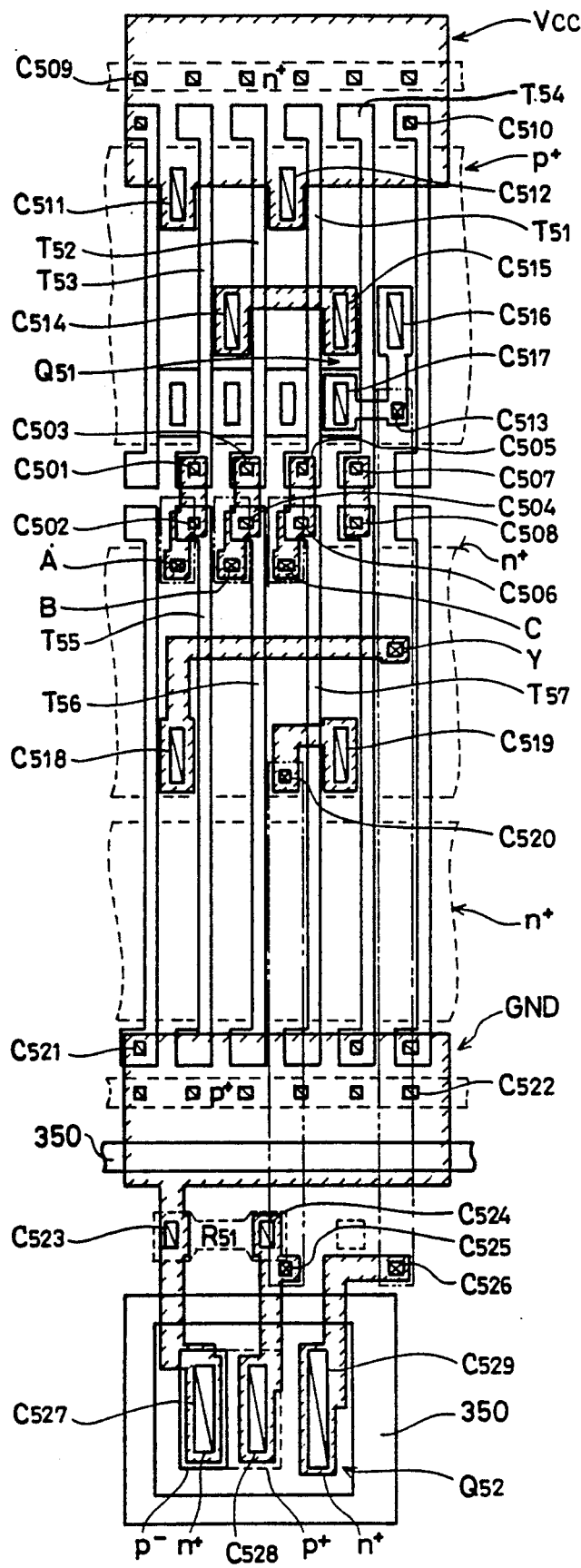
FIG. 12A is a plan view showing an interconnection pattern in accordance with which a three-input NAND circuit is structured by the basic cell of the Bi-CMOS gate array shown in FIG. 4B.
Figure 12B:
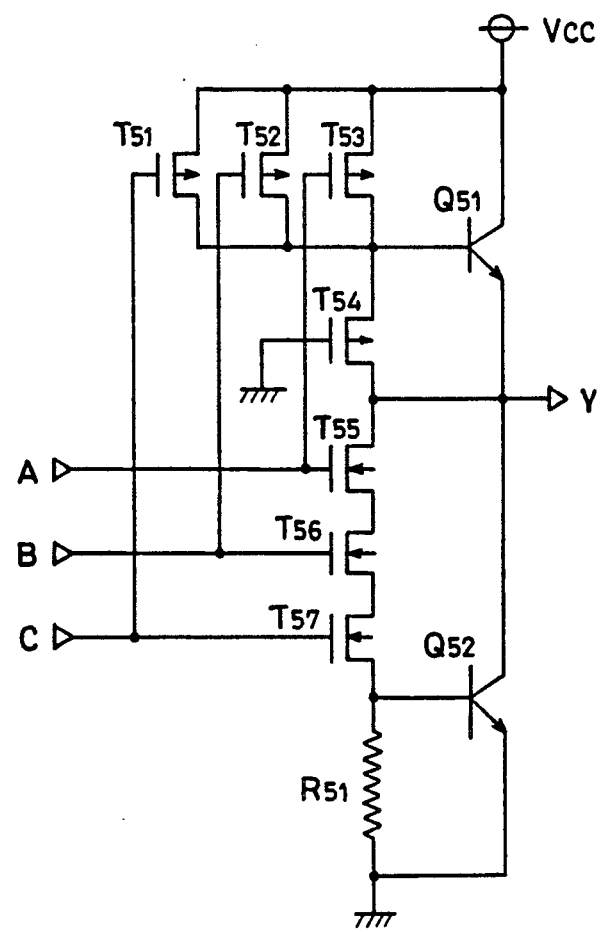
FIG. 12B is a circuit diagram of the three-input NAND circuit shown in FIG. 12A.

FIG. 12A shows an interconnection pattern in accordance with which the three-input NAND circuit shown in FIG. 12B is structured by the basic cells of FIG. 4B. As is clear from the comparison of FIG. 12B and FIG. 5B, in the circuit of FIG. 12B, the resistance R11 in FIG. 5B is replaced by a p-MOS transistor T54 for use as an on-transistor and one more p-MOS transistor and n-MOS transistor are added. The rest of the structure is substantially the same as that of the embodiment shown in FIG. 10 and the same numerals or representations are allotted to the corresponding portions and therefore no description will be give thereto.

Figure 13A:
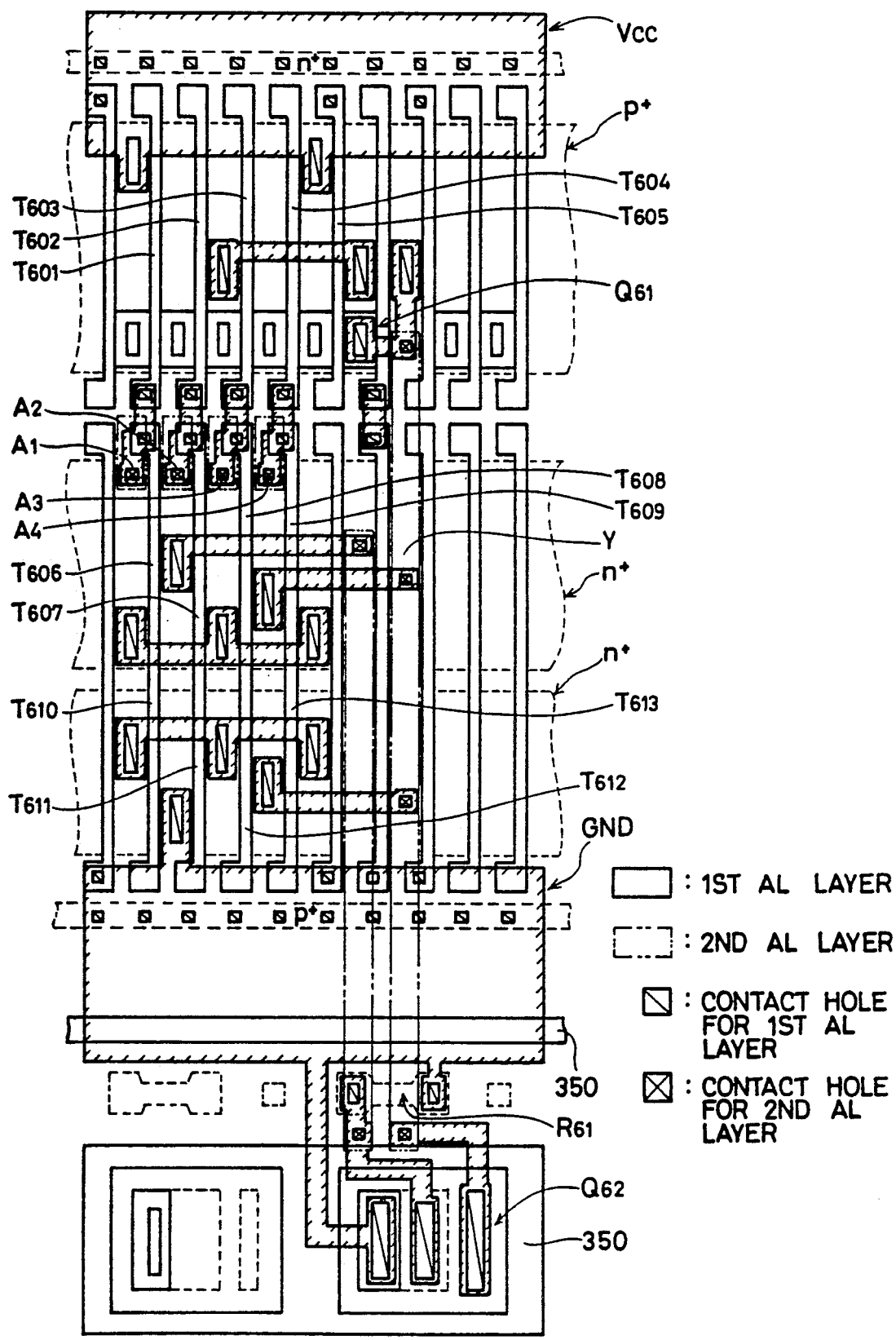
FIG. 13A is a plan view showing an interconnection pattern in accordance with which another logic circuit is structure by the basic cell of the Bi-CMOS gate array shown in FIG. 4B.
Figure 13B:
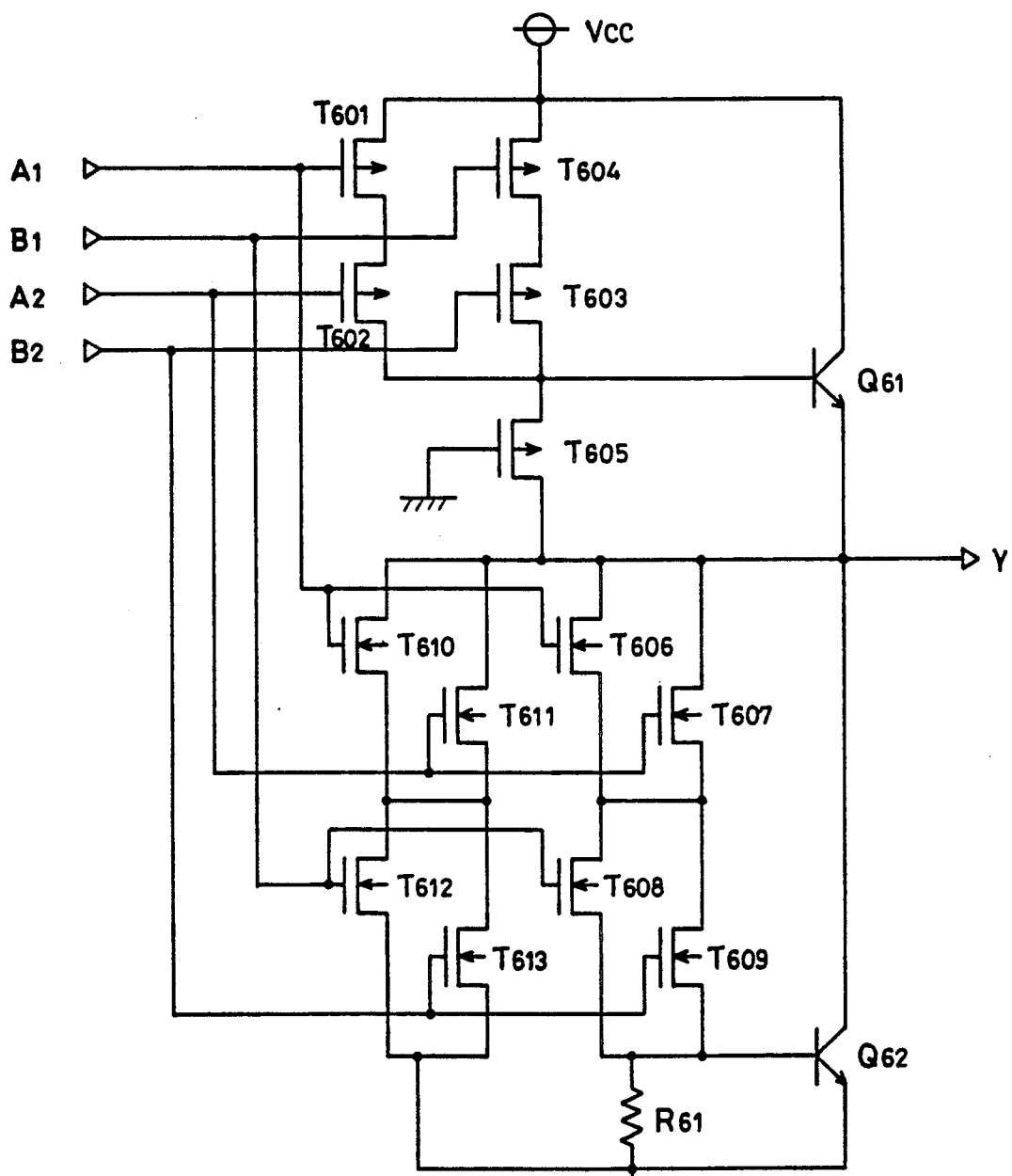
FIG. 13B is a circuit diagram showing the circuits formed in FIG. 13A.
Figure 13C:
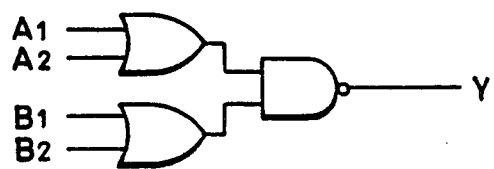
FIG. 13C is a diagram showing a logic circuit corresponding to FIG. 13B.

FIG. 13A shows an interconnection pattern in accordance with which the circuit shown in FIG. 13B, that is, the logic circuit shown in FIG. 13C is structured by the basic cell of FIG. 4B. Referring to FIG. 13C, an operation of the logic circuit is that only when any one or both of inputs A1 and A2 and any one or both of inputs B1 and B2 attain the high level (for example, input voltage is Vcc = 5V), the output Y attains the low level (for example, 0V). Described with reference to the circuit diagram of the transistor shown in FIG. 13B, if the A1 or the A2 is at the high level, n-MOS transistors T610 and T606, or T611 and T607 are turned on, and if the B1 or the B2 is at the high level, n-MOS transistors T612 and T608, or T613 and T609 are turned on so as to be conductive between the collector and the base of a bipolar transistor Q62. As a result, the current discharged through the load capacitance connected to a terminal of the output Y becomes a base current of the bipolar transistor Q62 through any of paths of the n-MOS transistors T606 to T609. Consequently, the bipolar transistor Q62 is turned on.

Since in case of p-MOS transistors T601 and T602, only when both of the inputs A1 and A2 are at the low level and in case of p-MOS transistors T603 and T604, only when both of the inputs B1 and B2 are at the low level, a current flows from the power supply Vcc to a base of a bipolar transistor Q61, the bipolar transistor Q61 is in an on state, and in other occasions than the above, it is in an off state. Accordingly, the output Y attains the low level. The n-MOS transistors T610 to T613 are MOS transistors added to a conventional BiCMOS gate for enhancing an operation rate.

Figure 14B:
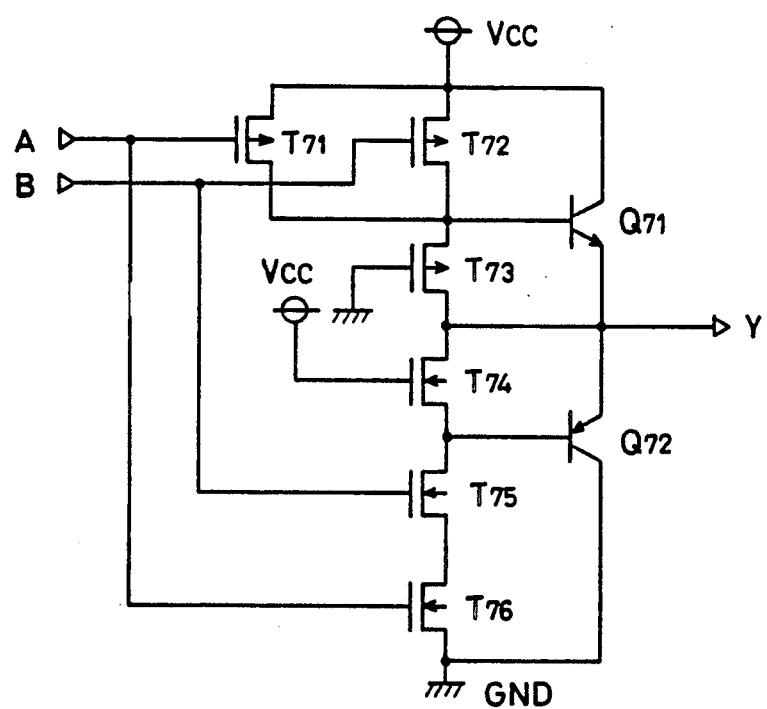
FIG. 14B is a circuit diagram of the two-input NAND circuit shown in FIG. 14A.

FIG. 14A shows a further interconnection pattern in accordance with which a still further variation of a two-input NAND circuit (FIG. 14B) is structured by the basic cells of FIG. 3C. As is clear from the comparison of FIG. 14B and FIG. 5B, in the circuit of FIG. 14B, provided are a p-MOS transistor T73 and an n-MOS transistor T74 for use as on-transistors instead of the resistances R11 and R12 in the circuit of FIG. 5B and a pnp bipolar transistor Q72 instead of the npn bipolar transistor Q12. As the foregoing, in order to constitute the two-input NAND circuit using an npn bipolar transistor and a pnp bipolar transistor, used is the basic cell in which a region for forming pnp bipolar transistors is incorporated in an n-MOS transistor region (FIG. 3C).

Now referring to FIGS. 15A to 15D and 16A to 16D, a method of manufacturing the basic cell of the BiCMOS gate array shown in FIGS. 3B, 3D and 3E will be described.

Figure 15A:
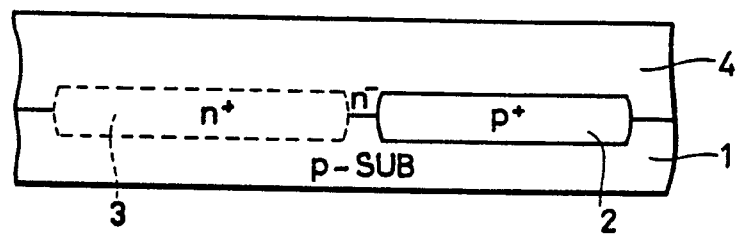
FIGS. 15A, 15B, 15C and 15D are partial sectional views showing a method of manufacturing a basic cell of the Bi-CMOS gate array according to the present invention in a sequential step, and which correspond to FIG. 3D.
Figure 16A:
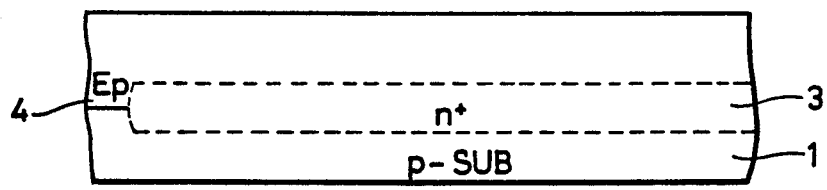
FIGS. 16A, 16B, 16C and 16D are partial sectional views showing a method of manufacturing a basic cell of the Bi-CMOS gate array according to the present invention in a sequential step, and which correspond to FIG. 3E.

Referring to FIGS. 15A and 16A, a p+ buried layer 2 and an n+ buried layer 3 are formed spaced apart from each other on a p type silicon substrate 1. An impurity concentration of the n+ buried layer 3 is, for example, $2 \times 10^{19}/cm^3$ as antimony concentration. An impurity concentration of the p+ buried layer 2 is, for example, $8 \times 10^{17}/cm^3$ as boron concentration. An n− epitaxial layer 4 is formed on these buried layers by epitaxial growth method. An impurity concentration of the epitaxial layer 4 is $4 \times 10^{14}/cm^3$.

Figure 15B:
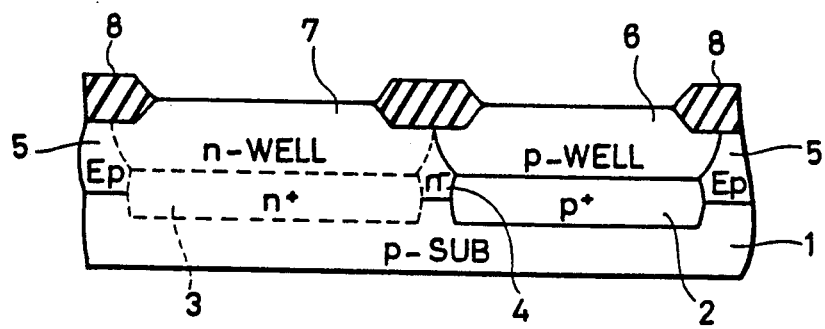
Figure 16B:
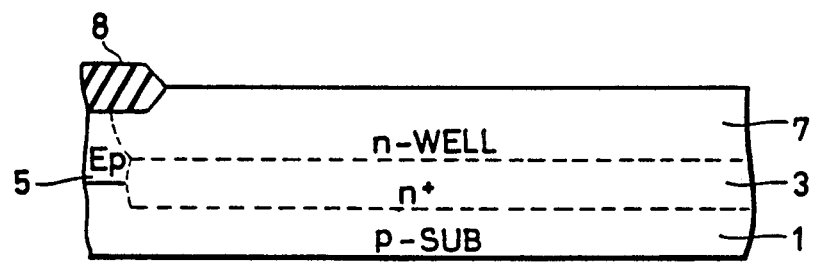

Referring to FIGS. 15B and 16B, an n-well layer 7 having, for example, a phosphorus concentration of $4 \times 10^{16}/cm^3$ is formed on the n+ buried layer 3. A p-well layer 6 having, for example, a boron concentration of $2 \times 10^{16}/cm^3$ is formed on the p+ buried layer 2. These well layers are formed by diffusing impurities from a surface of the epitaxial layer 4, and which forms n− epitaxial layers 4 and 5 under the respective well layers. A thick isolation oxide film 8 for isolating element regions is formed on an upper surface between the respective well layers so as to have a film thickness of about 500–700 mm.

Figure 15C:
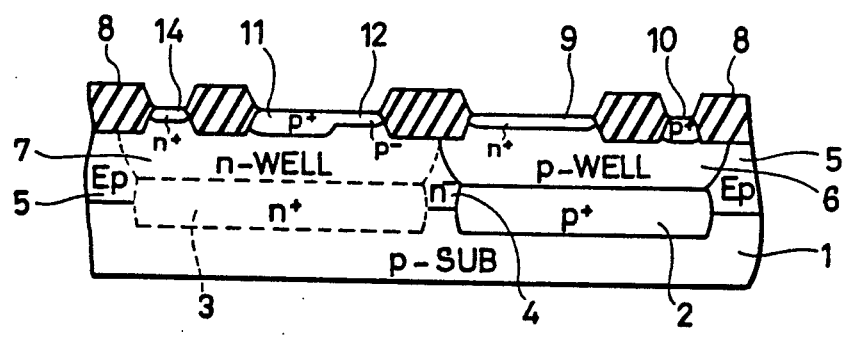
Figure 16C:
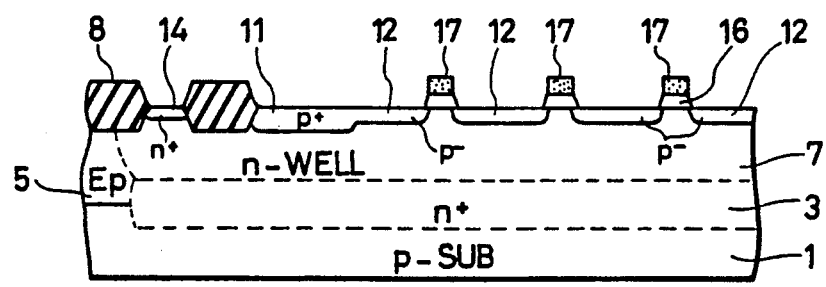

Referring to FIGS. 15C and 16C, gate oxide films 16 and gate electrodes 17 are selectively formed spaced apart from each other on the surface of each of well layers, thereby forming gate electrodes in n-MOS transistor regions and p-MOS transistor regions. Using these gate electrodes 17 and the isolation oxide films 8 as masks, formed are p+ impurity diffusion layer 11 as a base-contact region of the bipolar transistor or source or drain region of the p-MOS transistor and a p+ impurity diffusion layer 10 as a region for taking out the potential of substrate in the p-well layer 6 of the n-MOS transistor. An impurity concentration of thus formed p+ impurity diffusion layer is, for example, $8 \times 10^{19}/cm^3$ as boron concentration. Thereafter, formed are an n+ impurity diffusion layer 9 as source or drain region of the n-MOS transistor and an n+ impurity diffusion layer 14 as a region for taking out the potential of substrate in the n-well layer 7 of the p-MOS transistor. An impurity concentration of thus formed n+ impurity diffusion layer is, for example, $2 \times 10^{20}/cm^3$ as arsenic concentration. Furthermore, formed is a p⁻ impurity diffusion layer 12 as a base region so as to be adjacent to the p+ impurity diffusion layer 11 as the base-contact region of the bipolar transistor. An impurity concentration of thus formed p⁻ impurity diffusion layer is, for example, $1 \times 10^{18}/cm^3$ as boron concentration.

Figure 15D:
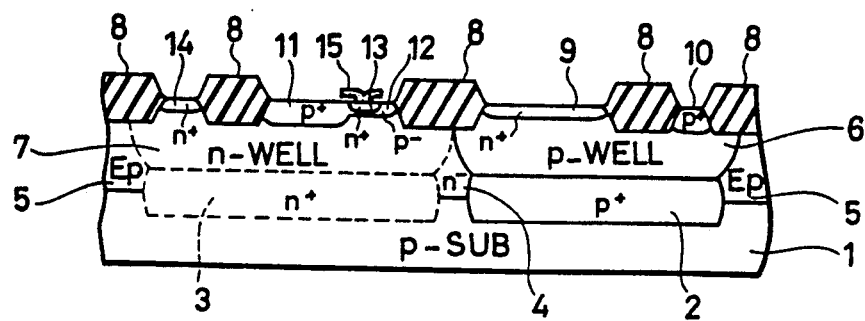
Figure 16D:
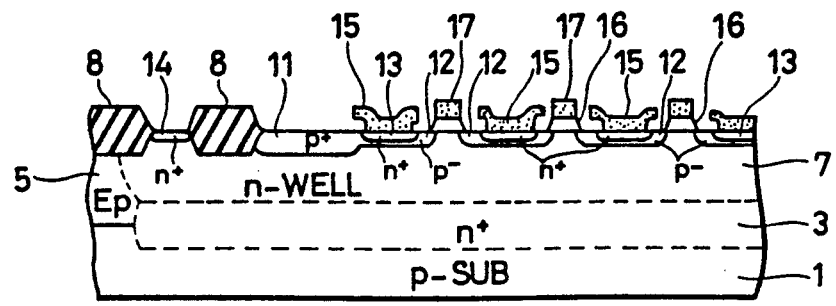

Referring to FIGS. 15D and 16D, after the formation of the respective impurity diffusion layers, a window is made for forming an emitter in the region of the p⁻impurity diffusion layer 12 as the base region. An emitter electrode 15 formed of polycrystalline silicon including n type impurities is formed in contact with the surface of the p⁻ impurity diffusion layer 12 through the window. The n type impurities are diffused into the p⁻impurity diffusion layer 12 through the electrode 15 for emitter, so that an n+ impurity diffusion layer 13 as an emitter region is formed. An impurity concentration of thus formed n+ impurity diffusion layer 13 is, for example, $3 \times 10^{20} cm^3$ as arsenic concentration. In this way, the basic cell of the Bi-CMOS gate array shown in FIG. 3B is completed.

Figure 17:
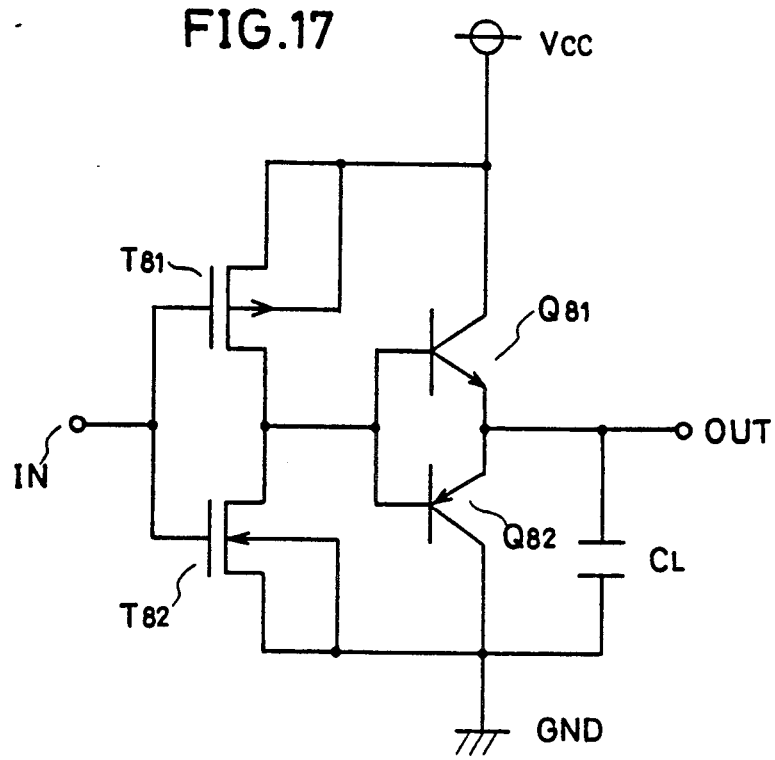
FIG. 17 is a circuit diagram of an inverter circuit.

FIG. 17 is a circuit diagram showing an inverter which can be structured by a basic cell of a Bi-CMOS gate array according to the present invention. An input terminal IN is connected in parallel to each gate of a p-MOS transistor T81 and an n-MOS transistor T82. A source of the p-MOS transistor T81 is connected to the power supply (voltage Vcc) with a substrate connected to the source. In addition, the source of the p-MOS transistor T81 is connected to a collector of an npn bipolar transistor Q81. A drain of the p-MOS transistor T81 is connected to bases of the npn bipolar transistor Q81 and a pnp bipolar transistor Q82 and a drain of the n-MOS transistor T82. A source of the n-MOS transistor T82 is connected to a ground potential together with its substrate and a collector of the pnp bipolar transistor Q82.

An emitter of the pnp bipolar transistor Q82 is connected to the output OUT together with an emitter of the npn bipolar transistor Q81. An elastic load capacitance CL is formed between the output terminal OUT and a ground point.

In such an inverter gate circuit, when the input terminal IN is at a low level potential (ground potential), the p-MOS transistor T81 is turned on and the n-MOS transistor T82 is turned off, so that a base potential of the npn bipolar transistor Q81 attains the high level, thereby turning on the npn bipolar transistor Q81. On the other hand, the pnp bipolar transistor Q82 is turned off because a base potential thereof is at the high level, and therefore the load capacitance CL is charged and a signal of a high level is outputted from the output terminal Y.

When the input terminal IN attains the high level after this state, the p-MOS transistor T81 is turned off and the n-MOS transistor T82 is turned on, so that the base potential of the npn bipolar transistor Q81 attains the low level, thereby turning off the npn bipolar transistor Q81. On the other hand, the pnp bipolar transistor Q82 is turned on because a base potential thereof is at the low level, and therefore the load capacitance CL is discharged and a signal of the low level is outputted from the output terminal Y.

Figure 18:
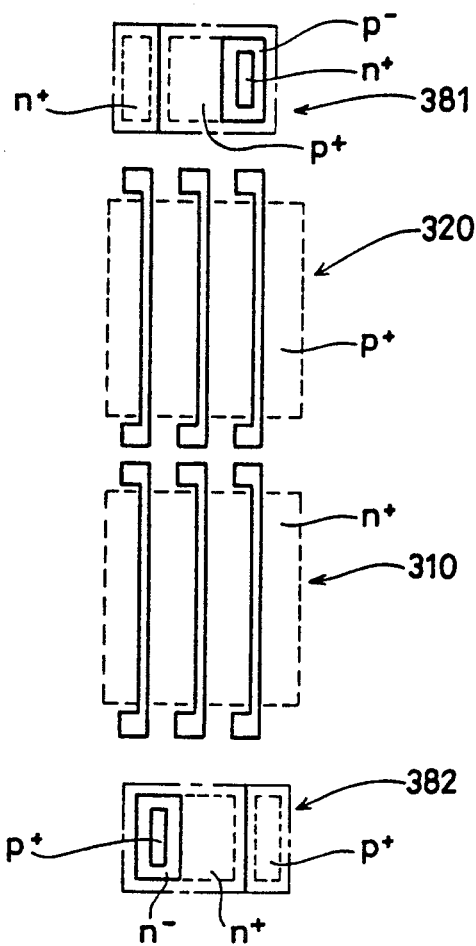
FIG. 18 is a plan view showing a structure of the basic cell of the Bi-CMOS gate array for use to structure the inverter circuit shown in FIG. 17 as an example to be compared with the present invention.

As a basic cell constituting such an inverter circuit, what is thinkable is a basic cell shown as an example to be compared with the present invention shown in FIG. 18, on the analogy of the conventional basic cell shown in FIGS. 2A and 2B. In this basic cell, a region 381 for forming npn bipolar transistors and a region 382 for forming pnp bipolar transistors are formed at the opposite outer sides of the n-MOS transistor region 310 and the p-MOS transistor region 320.

FIG. 19A shows a structure of a basic cell of a Bi-CMOS gate array according to the present invention for the example to be compared with the present invention shown in FIG. 18. The region 381 for forming npn transistors and the region 382 for forming pnp bipolar transistors provided at the opposite outer sides of the p-MOS transistor region 320 and the n-MOS transistor region 310 in the example for comparison are replaced by a region 361 for forming npn bipolar transistors and a region 362 for forming pnp bipolar transistors which are provided in the p-MOS transistor region 320 and the n-MOS transistor region 310 respectively. Namely, an n+ impurity diffusion layer 13 and a p⁻ impurity diffusion layer 12 as an emitter region and a base region of a npn bipolar transistor are disposed between the gate electrodes 17 of the p-MOS transistor region 320. In addition, as a collector region, an n+ impurity diffusion layer 14 is formed along an outer edge of the p-MOS transistor region 320. A base-contact region 11 of the npn transistor also serves as source or drain region of a p-MOS transistor. The collector region 14 also serves as a region for taking out the potential of substrate in the p-MOS transistor.

In addition, as an emitter region and a base region of the pnp bipolar transistor, a p+ impurity diffusion layer 25 and an n+ impurity diffusion layer 24 are disposed between the gate electrodes 17 of the n-MOS transistor region 310. In addition, as a collector region, a p+ impurity diffusion layer 10 is formed along an outer edge of the n-MOS transistor region 310. A base-contact region 23 of this pnp bipolar transistor also serves as source or drain region of the n-MOS transistor. In addition, the collector region 10 also serves as a region for taking out the potential of substrate in the n-MOS transistor.

Figure 20:
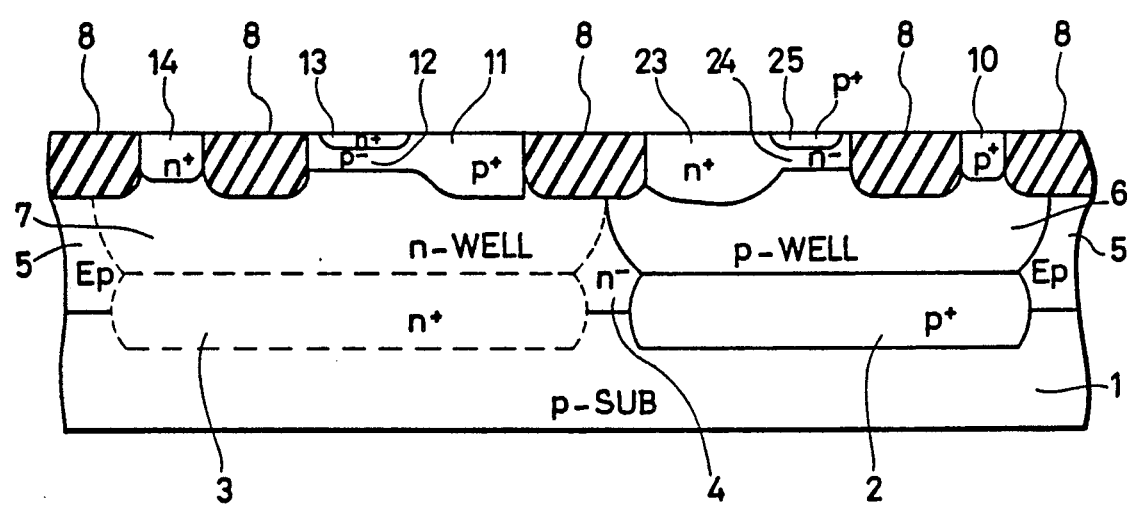
FIG. 20 is a partial sectional view taken along a line XX—XX of FIG. 19A.

Referring to FIG. 20, n⁻ epitaxial layers 4 and 5 are formed on the p type silicon substrate 1. An n+ buried layer 3 and a p+ buried layer 2 are formed spaced apart from each other by a predetermined interval on the p type silicon substrate 1. An n-well layer 7 is formed on the n+ buried layer 3 and a p-well layer 6 is formed on the p+ buried layer 2. Isolation oxide films 8 are formed spaced apart from each other by a suitable interval on the surfaces of the epitaxial layers 4 and 5. An n+ impurity diffusion layer 23 and a p+impurity diffusion layer 10 are formed spaced apart from each other in the region of the p-well layer 6. An n⁻ impurity diffusion layer 24 is formed so as to be in contact with the n+ impurity diffusion layer 23. A p+ impurity diffusion layer 25 is formed in the region of the n⁻ impurity diffusion layer 24.

A p+ impurity diffusion layer 11 and an n+ impurity diffusion layer 14 are formed spaced apart from each other in the region of the n-well layer 7. A p⁻ impurity diffusion layer 12 is formed so as to be in contact with the p+impurity diffusion layer 11. An n⁻impurity diffusion layer 13 is formed in the region of the p⁻impurity diffusion layer 12.

Figure 21:
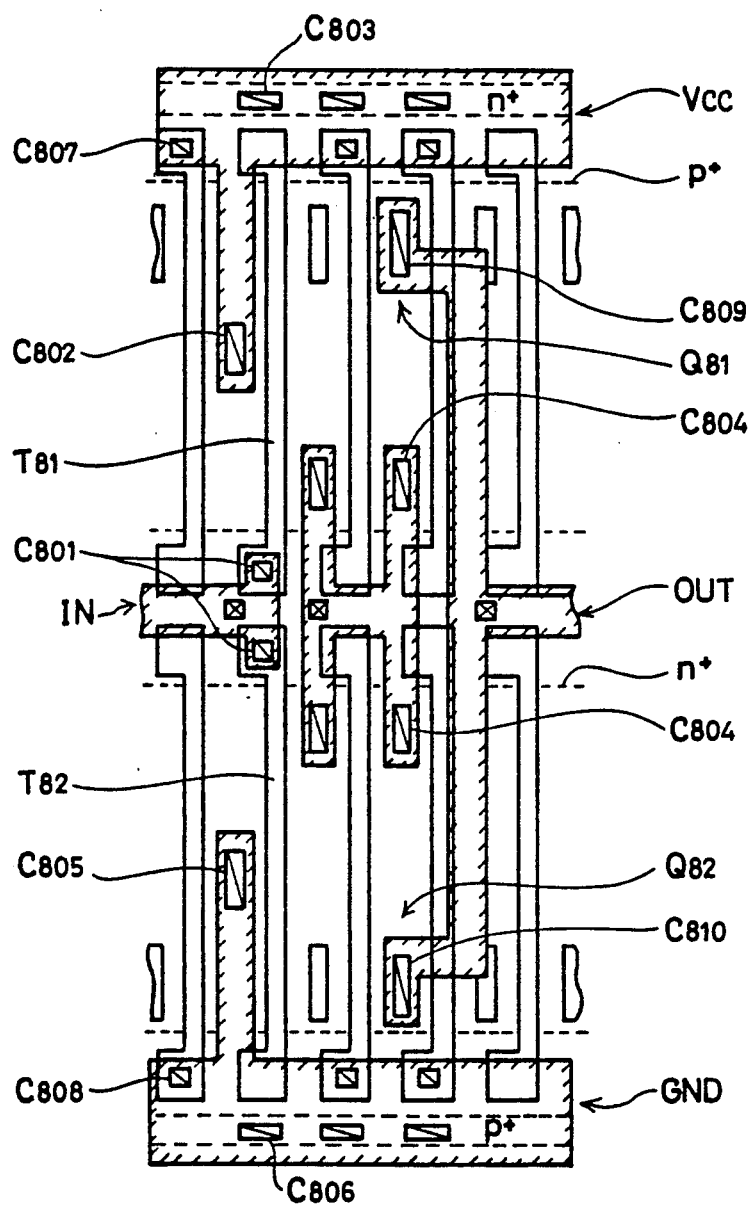
FIG. 21 is a plan view showing a pattern in accordance with which the inverter circuit shown in FIG. 17 is structured by the basic cell of the Bi-CMOS gate array shown in FIG. 19A.

Referring to FIG. 21, shown is an interconnection pattern in accordance with which the inverter circuit of FIG. 17 is structured by using the basic cell shown in FIGS. 19A and 20. The input terminal IN is connected in parallel to each gate of the p-MOS transistor T81 and the n-MOS transistor T82 through a contact hole C801.

The source of the p-MOS transistor T81 is connected to the power supply Vcc through a contact hole C802. In addition, the source of the p-MOS transistor T81 is connected to the region for taking out the potential of substrate through a contact hole C803. The drain of the p-MOS transistor T81 is connected to a base of the npn bipolar transistor, a base of the pnp bipolar transistor and the drain of the n-MOS transistor T82 through a contact hole C804. The source of the n-MOS transistor T82 is connected to the ground potential through a contact hole C805. The region for taking out the potential of substrate in the n-MOS transistor T82 and the collector region of the pnp bipolar transistor Q82 are connected to the ground potential through a contact hole C806. The emitter region of the pnp bipolar transistor Q82 and the emitter region of the npn bipolar transistor Q81 are connected to the output terminal OUT through a contact hole C810 and a contact hole C809 respectively. Contact holes C807 and C808 are for supplying a predetermined potential, that is, a power supply potential or a ground potential to isolate each transistor.

FIG. 19B shows a variation of that of FIG. 19A. According to the basic cell of FIG. 19B, the region 361 for forming npn bipolar transistors and the region 362 for forming pnp bipolar transistors ar disposed in the central portions of the p-MOS transistor region 320 and the n-MOS transistor region 310 respectively. Therefore, the p+impurity diffusion layer 11 and the n+impurity diffusion layer 23 as base-contact regions are disposed at the opposite sides of the n+ and the p+impurity diffusion layers 13 and 25 as the emitter regions respectively. Namely, the base terminal can be disposed at the opposite sides of each emitter terminal. This allows a base resistance to be small, so that npn and pnp bipolar transistors of higher performance can be obtained.

As the foregoing, according to the present invention, it is possible to provide a region for forming bipolar transistors in a region for forming field effect transistors, and the bipolar transistors are used isolated from the field effect transistors, thereby making it possible to reduce an area occupied by unit cells. Accordingly, a degree of integration of a semiconductor integrated circuit device such as a gate array can be drastically increased.

What is claimed is:

1. A semiconductor integrated circuit device having only a single unit cell structure, combining a region for forming complementary field effect transistors and a region for forming bipolar transistors, comprising:
   a semiconductor substrate having a major surface,
   a semiconductor layer of a first conductivity type formed on the major surface of said semiconductor substrate,
   a semiconductor layer of a second conductivity type formed on the major surface of said semiconductor substrate,
   a plurality of first impurity regions of the first conductivity type formed spaced apart from each other in a first direction in a region of said semiconductor layer of the second conductivity type and having a predetermined width,
   a plurality of first impurity regions of the second conductivity type formed spaced apart from each other in a region of said semiconductor layer of the first conductivity type and having a predetermined width,
   a second impurity region of the second conductivity type formed spaced apart from said first impurity regions of the first conductivity type in the region of said semiconductor layer of the second conductivity type and extending in said first direction,
   a second impurity region of the first conductivity type formed spaced apart from said first impurity regions of the second conductivity type in the region of said semiconductor layer of the first conductivity type and extending in said first direction,
   a plurality of first conductive layers formed spaced apart from each other in said first direction between said first impurity regions of the first conductivity type on said semiconductor layer of the second conductivity type through an insulation film,
   a plurality of second conductive layers formed spaced apart from each other in said first direction between said first impurity regions of the second conductivity type on said semiconductor layer of the first conductivity type through an insulation film and
   a plurality of third impurity regions each formed in each of the first impurity regions of one of said first and second conductivity types and having a conductivity type opposite to that of the first impurity regions,
   said unit cell being constituted by
      a region for forming field effect transistors of the first conductivity type, using said first conductive layers as gates and said first impurity regions of the first conductivity type disposed at the opposite sides of the gates as source and drain regions,
      a region for forming field effect transistors of the second conductivity type, using said second conductive layers as gates and said first impurity regions of the second conductivity type disposed at the opposite sides of the gates as source and drain regions, and
      a region for forming bipolar transistors using said third impurity regions as emitter regions, said first impurity regions of the one conductivity type as base regions and said second impurity regions formed as collector regions in the region of said semiconductor layers in which said first impurity regions of the one conductivity type are disposed,
   said unit cell structure including a plurality of emitter regions for said bipolar transistors in each of said source and drain regions,
   wherein each of said unit cell structures including MOS and bipolar transistor regions has a substantially identical width in said first direction,
   thereby providing a gate array including only a single unit cell structure having both MOS and bipolar transistor regions.

2. A semiconductor integrated circuit device according to claim 1, wherein
   said first impurity regions of the one conductivity type comprise impurity regions of a high concentration and impurity regions of a low concentration, said third impurity regions being formed in said impurity regions of the low concentration, and said impurity regions of the low concentration constituting base regions, and said impurity regions of the high concentration constituting base-contact regions.

3. A semiconductor integrated circuit device according to claim 1, further comprising an other region for forming bipolar transistor formed to be isolated.

4. A semiconductor integrated circuit device according to claim 1, wherein said first conductive layers, said second conductive layers and said third impurity region are aligned in a second direction different from said first direction.

5. A semiconductor integrated circuit device according to claim 4, wherein said third impurity regions are disposed at one end portion of said second direction in said first impurity regions of the one conductivity type.

6. A semiconductor integrated circuit device according to claim 4 wherein said second direction is perpendicular to said first direction.

7. A semiconductor integrated circuit device according to claim 1, wherein said third impurity regions are aligned in said first direction.

8. A semiconductor integrated circuit device according to claim 1, wherein said collector region is also used as a region for taking out the potential of said semiconductor layer.

9. A semiconductor integrated circuit device having only a single unit cell structure, combining a region for forming complementary field effect transistors and a region for forming bipolar transistors, comprising:
  a semiconductor substrate having a major surface,
  a semiconductor layer of a first conductivity type formed on the major surface of said semiconductor substrate,
  a semiconductor layer of a second conductivity type formed on the major surface of said semiconductor substrate,
  a plurality of first impurity regions of the first conductivity type formed spaced apart from each other in a first direction in a region of said semiconductor layer of the second conductivity type and having a predetermined width,
  a plurality of first impurity regions of the second conductivity type formed spaced apart from each other in the first direction in a region of said semiconductor layer of the first conductivity type and having a predetermined width,
  a second impurity region of the second conductivity type formed spaced apart from said first impurity region of the first conductivity type in the region of said semiconductor layer of the second conductivity type and extending in said first direction,
  a second impurity region of the first conductivity type formed spaced apart from said first impurity regions of the second conductivity type in the region of said semiconductor layer of the first conductivity type and extending in said first direction,
  a plurality of first conductive layers formed spaced apart from each other in said first direction between said first impurity regions of the first conductivity type on said semiconductor layer of the second conductivity type through an insulation film,
  a plurality of second conductive layers formed spaced apart from each other in said first direction between said first impurity regions of the second conductivity type on said semiconductor layer of the first conductivity type through an insulation film,
  a plurality of third impurity regions of the second conductivity type each formed in each of said first impurity regions of the first conductivity type,
  a plurality of third impurity regions of the first conductivity type each formed in each of said first impurity regions of the second conductivity type,
  said single unit cell structure being constituted by:
    a region for forming field effect transistors of the first conductivity type, using said first conductive layers as gates and said first impurity regions of the first conductivity type disposed at the opposite sides of the gates as source and drain regions,
    a region for forming field effect transistors of the second conductivity type, using said second conductive layers as gates and said first impurity regions of the second conductivity type disposed at the opposite sides of the gates as source and drain regions,
    a region for forming first bipolar transistors using said third impurity regions of the second conductivity type as emitter regions, said first impurity regions of the first conductivity type as base regions and said second impurity regions of the second conductivity type as collector regions,
  a region for forming second bipolar transistors using said third impurity regions of the first conductivity type as emitter regions, said first impurity regions of the second conductivity type as base regions and said second impurity regions of the first conductivity type as collector regions,
  said unit cell structure including a plurality of emitter regions for said bipolar transistors in each of said source and drain regions,
  wherein each of said unit cell structures including MOS and bipolar transistor regions has a substantially identical width in said first direction,
  thereby providing a gate array including only a single unit cell structure having both MOS and bipolar transistor regions.

10. A semiconductor integrated circuit device according to claim 9, wherein said first conductive layer, said second conductive layer, said third impurity region of the first conductivity type and said third impurity region of the second conductivity type are aligned in a second direction different from said first direction.

11. A semiconductor integrated circuit device according to claim 10, wherein said third impurity regions of the first conductivity type are respective disposed at one end portion of said second direction in said first impurity regions of the second conductivity type and said third impurity regions of the second conductivity type are respectively disposed at one end portions of said second direction in said first impurity regions of the first conductivity type.

12. A semiconductor integrated circuit device according to claim 10 wherein said second direction is perpendicular to said first direction.

13. A semiconductor integrated circuit device according to claim 9, wherein said third impurity regions of the first conductivity type and said third impurity regions of the second conductivity type, are aligned respectively in said first direction.

14. A semiconductor integrated circuit device according to claim 9, wherein said third impurity regions of the first conductivity type are respective disposed at center portions of said second direction in said first impurity regions of the second conductivity type and said third impurity regions of the second conductivity type are respectively disposed at center portions of said second direction in said first impurity regions of the first conductivity type.

15. A semiconductor integrated circuit device having only a single unit cell structure, combining a region for forming complementary field effect transistors and a region for forming bipolar transistors, comprising:
   a semiconductor substrate having a major surface,
   a semiconductor layer of a first conductivity type formed on the major surface of said semiconductor substrate,
   a semiconductor layer of a second conductivity type formed on the major surface of said semiconductor substrate,
   a plurality of first impurity regions of the first conductivity type formed spaced apart from each other in a first direction in a region of said semiconductor layer of the second conductivity type in a first direction and having a predetermined width,
   a plurality of first impurity regions of the second conductivity type formed spaced apart from each other in the first direction in a region of said semiconductor layer of the first conductivity type and having a predetermined width,
   a second impurity region of the second conductivity type formed spaced apart from said first impurity regions of the first conductivity type in said semiconductor layer of the second conductivity type and extending in said first direction,
   a second impurity region of the first conductivity type formed spaced apart from said first impurity regions of the second conductivity type in the region of said semiconductor layer of the first conductivity type and extending in said first direction,
   a plurality of first conductive layers formed spaced apart from each other in said first direction between said first impurity regions of the first conductivity type on said semiconductor layer of the second conductivity type through an insulation film,
   a plurality of second conductive layers formed spaced apart from each other in said first direction between said first impurity regions of the second conductivity type on said semiconductor layer of the first conductivity type through an insulation film,
   a plurality of third impurity regions each formed in each of the first impurity regions of one of said first and second conductivity types and having a conductivity type opposite to that of said first impurity regions, said single unit cell structure being constituted by:
   a region for forming field effect transistors of the first conductivity type, using said first conductive layers as gates and said first impurity regions of the first conductivity type disposed at the opposite sides of the gates as source and drain regions,
   a region for forming field effect transistors of the second conductivity type, using said second conductive layers as gates and said first impurity regions of the second conductivity type disposed at the opposite sides of the gates as source and drain regions,
   a region for forming bipolar transistors using said third impurity regions as emitter regions, said first impurity regions of the one conductivity type as base regions, and said second impurity regions formed as collector regions in the region of said semiconductor layers in which said first impurity regions of one conductivity type are disposed,
said unit cell structure including a plurality of emitter regions for said bipolar transistors in each of said source and drain regions,
wherein each of said unit cell structures including MOS and bipolar transistor regions has a substantially identical width in said first direction,
thereby providing a gate array including only a single unit cell structure having both MOS and bipolar transistor regions,
said base regions being electrically isolated from the other of said base regions adjacent thereto through said gates in said first direction by holding said gates disposed at the opposite sides of said base regions at a first potential, said field effect transistors being rendered active by holding said gates disposed between said source and drain regions at a second potential.

16. A semiconductor integrated circuit device according to claim 15, wherein said active field effect transistors are electrically isolated from said adjacent gates in said first direction by holding the gates disposed at the opposite sides of the source and drain regions of said active field effect transistors at said first potential.

* * * * *